(12) United States Patent
Yonehara et al.

(10) Patent No.: US 10,243,058 B2
(45) Date of Patent: Mar. 26, 2019

(54) SEMICONDUCTOR DEVICE AND ELECTRICAL DEVICE

(71) Applicant: Kabushiki Kaisha Toshiba, Minato-ku (JP)

(72) Inventors: Toshiya Yonehara, Kawasaki (JP); Hisashi Saito, Kawasaki (JP); Yosuke Kajiwara, Yokohama (JP); Daimotsu Kato, Kawasaki (JP); Tatsuo Shimizu, Shinagawa (JP); Yasutaka Nishida, Tama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/681,453

(22) Filed: Aug. 21, 2017

(65) Prior Publication Data

US 2018/0261681 A1    Sep. 13, 2018

(30) Foreign Application Priority Data

Mar. 10, 2017   (JP) ................. 2017-046139

(51) Int. Cl.
*H01L 29/66*   (2006.01)
*H01L 29/20*   (2006.01)
(Continued)

(52) U.S. Cl.
CPC .. *H01L 29/66431* (2013.01); *H01L 21/02321* (2013.01); *H01L 21/02329* (2013.01);
(Continued)

(58) Field of Classification Search
CPC ......... H01L 29/66431; H01L 29/66446; H01L 29/2003; H01L 29/205; H01L 29/778; H01L 29/7784; H01L 29/7786
See application file for complete search history.

(56) References Cited

U.S. PATENT DOCUMENTS 5,660,895 A * 8/1997 Lee ..................... C23C 16/401
257/E21.275
5,712,208 A * 1/1998 Tseng ................. H01L 21/28035
438/770

(Continued)

FOREIGN PATENT DOCUMENTS

| JP | 2007-189213 | 7/2007 |
| JP | 2016-082241 | 5/2016 |
| JP | 2016-181631 | 10/2016 |

*Primary Examiner* — Jesse Y Miyoshi
*Assistant Examiner* — Tuan A Hoang
(74) *Attorney, Agent, or Firm* — Oblon, McClelland, Maier & Neustadt, L.L.P.

(57) ABSTRACT

According to one embodiment, a semiconductor device includes a first semiconductor layer including a nitride semiconductor, a first electrode separated from the first semiconductor layer in a first direction, and a first insulating film including silicon and oxygen and being provided between the first semiconductor layer and the first electrode. The first insulating film has a first thickness in the first direction. The first insulating film includes a first position, and a distance between the first position and the first semiconductor layer is ½ of the first thickness. A first hydrogen concentration of hydrogen at the first position is $2.5 \times 10^{19}$ atoms/cm$^3$ or less.

21 Claims, 18 Drawing Sheets

(51) Int. Cl.
*H01L 29/205* (2006.01)
*H01L 21/02* (2006.01)
*H01L 29/778* (2006.01)
*H01L 29/51* (2006.01)
*H01L 29/201* (2006.01)
*H01L 29/78* (2006.01)
*H01L 29/417* (2006.01)
*H01L 29/423* (2006.01)

(52) U.S. Cl.
CPC ...... *H01L 21/02332* (2013.01); *H01L 29/201* (2013.01); *H01L 29/2003* (2013.01); *H01L 29/205* (2013.01); *H01L 29/51* (2013.01); *H01L 29/513* (2013.01); *H01L 29/518* (2013.01); *H01L 29/66446* (2013.01); *H01L 29/66462* (2013.01); *H01L 29/778* (2013.01); *H01L 29/7784* (2013.01); *H01L 29/7786* (2013.01); *H01L 29/7802* (2013.01); *H01L 29/41766* (2013.01); *H01L 29/4236* (2013.01)

(56) References Cited

U.S. PATENT DOCUMENTS

| | | | |
|---|---|---|---|
| 9,330,905 B2* | 5/2016 | Onizawa | H01L 21/02345 |
| 2005/0245034 A1* | 11/2005 | Fukuda | H01L 21/049 |
| | | | 438/285 |
| 2007/0158683 A1 | 7/2007 | Sheppard et al. | |
| 2010/0193839 A1* | 8/2010 | Takatani | H01L 29/7786 |
| | | | 257/192 |
| 2013/0256686 A1* | 10/2013 | Kanamura | H01L 29/205 |
| | | | 257/76 |
| 2016/0111547 A1 | 4/2016 | Yamazaki et al. | |
| 2016/0284830 A1 | 9/2016 | Shimizu | |
| 2016/0351564 A1* | 12/2016 | Azize | H01L 29/66704 |
| 2017/0250274 A1* | 8/2017 | Nakayama | H01L 21/02694 |

* cited by examiner

FIG. 8
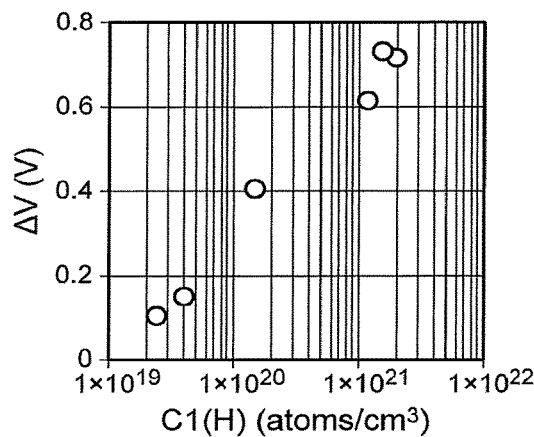
FIG. 8A
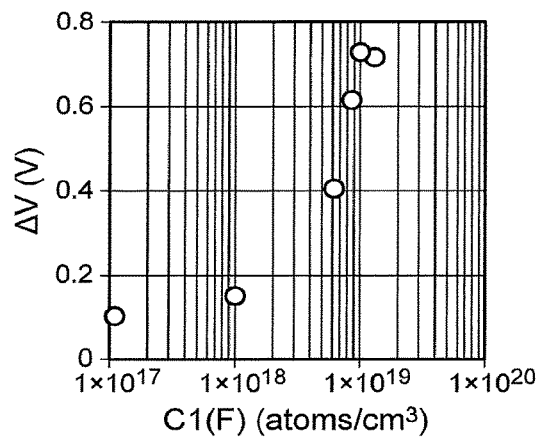
FIG. 8B
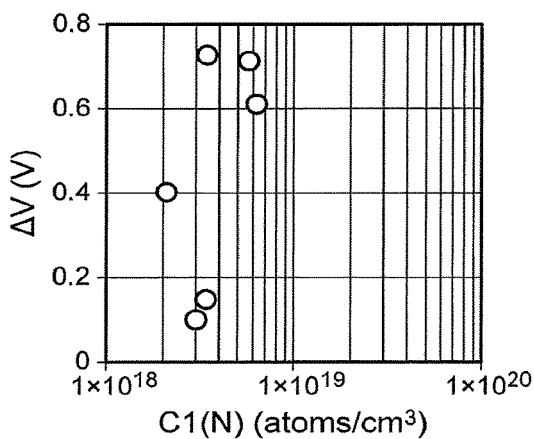
FIG. 8C
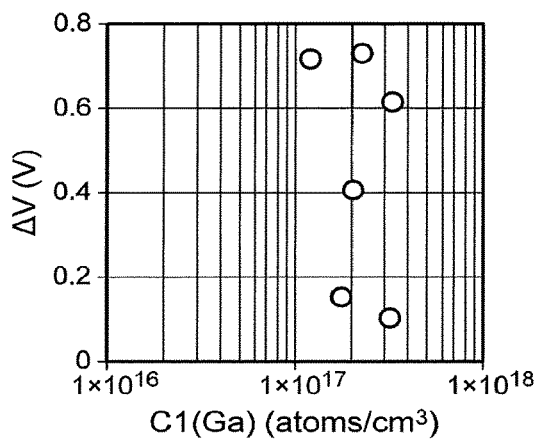
FIG. 8D

SEMICONDUCTOR DEVICE AND ELECTRICAL DEVICE

CROSS-REFERENCE TO RELATED APPLICATIONS

This application is based upon and claims the benefit of priority from Japanese Patent Application No. 2017-046139, filed on Mar. 10, 2017; the entire contents of which are incorporated herein by reference.

FIELD

Embodiments described herein relate generally to a semiconductor device and an electrical device.

BACKGROUND

There is a semiconductor device that uses a nitride semiconductor. Stable operations of the semiconductor device are desirable.

BRIEF DESCRIPTION OF THE DRAWINGS

FIG. 8A to FIG. 8D are graphs illustrating the experimental results;

DETAILED DESCRIPTION

Figure 1A:
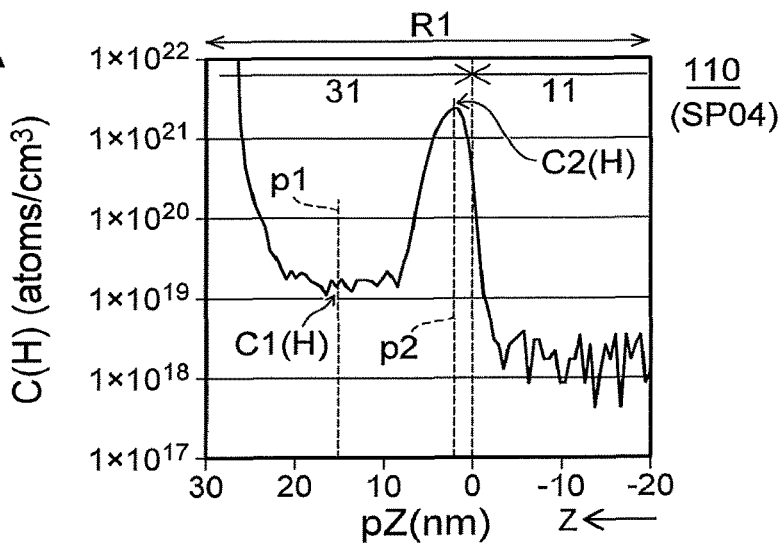
FIG. 1A to FIG. 1C are graphs illustrating a semiconductor device according to the embodiment.

According to one embodiment, a semiconductor device includes a first semiconductor layer including a nitride semiconductor, a first electrode separated from the first semiconductor layer in a first direction, and a first insulating film including silicon and oxygen and being provided between the first semiconductor layer and the first electrode. The first insulating film has a first thickness in the first direction. The first insulating film includes a first position, and a distance between the first position and the first semiconductor layer is ½ of the first thickness. A first hydrogen concentration of hydrogen at the first position is $2.5 \times 10^{19}$ atoms/cm$^3$ or less.

According to another embodiment, a semiconductor device includes a first semiconductor layer including a nitride semiconductor, a first electrode separated from the first semiconductor layer in a first direction, and a first insulating film including silicon and oxygen and being provided between the first semiconductor layer and the first electrode. The first insulating film has a first thickness in the first direction. The first insulating film includes a first position, and a distance between the first position and the first semiconductor layer is ½ of the first thickness. A first fluorine concentration of fluorine at the first position is $4 \times 10^{16}$ atoms/cm$^3$ or less.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
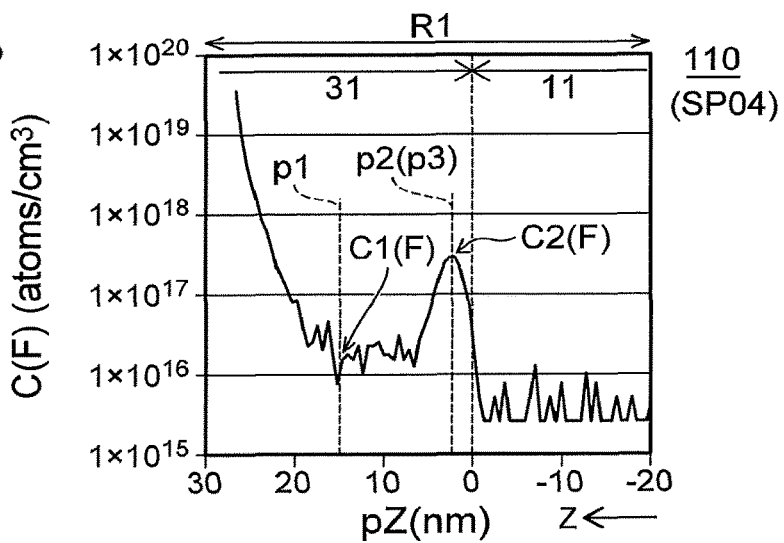
Figure 1C:
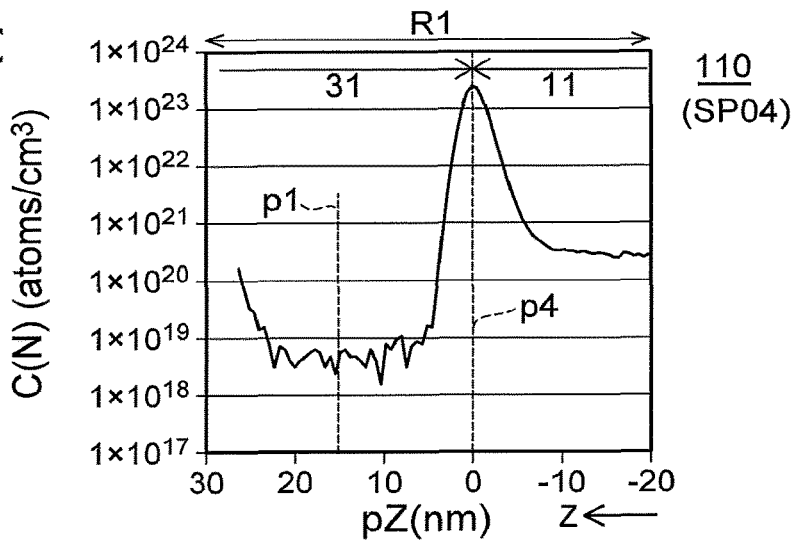
Figure 2:
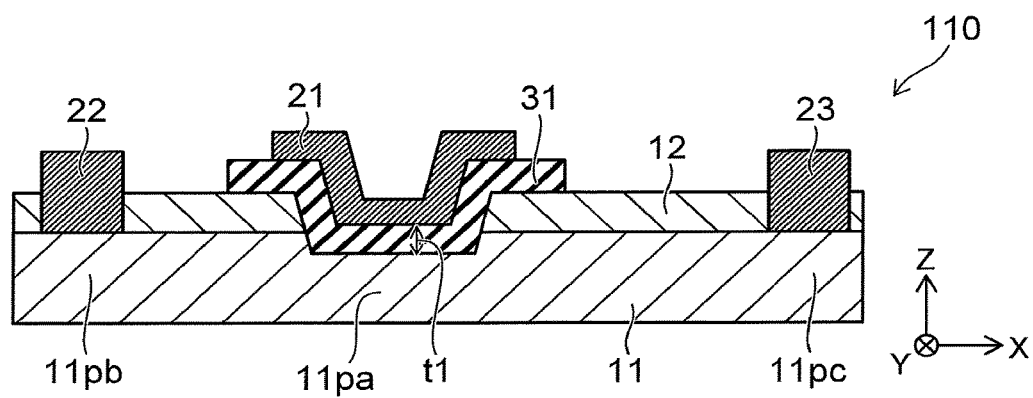
FIG. 2 is a schematic cross-sectional view illustrating the semiconductor device according to the first embodiment.

FIG. 1A to FIG. 1C are graphs illustrating a semiconductor device according to the embodiment. FIG. 2 is a schematic cross-sectional view illustrating the semiconductor device according to the first embodiment.

As shown in FIG. 2, the semiconductor device 110 according to the embodiment includes a first semiconductor layer 11, a first electrode 21, and a first insulating film 31. A second electrode 22, a third electrode 23, and a second semiconductor layer 12 are further provided in the example.

The first semiconductor layer 11 includes a nitride semiconductor. In the example, the first semiconductor layer 11 includes $Al_{x1}Ga_{1-x1}N$ ($0 \leq x1 < 1$). In the example described below, the first semiconductor layer 11 is GaN.

The first electrode 21 is separated from the first semiconductor layer 11 in a first direction.

The first direction is taken as a Z-axis direction. One direction perpendicular to the Z-axis direction is taken as an X-axis direction. A direction perpendicular to the Z-axis direction and the X-axis direction is taken as a Y-axis direction.

The first insulating film 31 is provided between the first semiconductor layer 11 and the first electrode 21. The first insulating film 31 includes silicon and oxygen. The first insulating film 31 is, for example, substantially silicon oxide. As described below, the first insulating film 31 may include other elements (e.g., an impurity).

The third electrode 23 is separated from the second electrode 22 in a second direction. The second direction crosses the first direction. The second direction is, for example, the X-axis direction.

The first semiconductor layer 11 includes a first partial region 11pa, a second partial region 11pb, and a third partial region 11pc. The first partial region 11pa is positioned between the second partial region 11pb and the third partial region 11pc. The direction from the second partial region 11pb toward the third partial region 11pc is aligned with the second direction (e.g., the X-axis direction).

The second electrode 22 is electrically connected to the second partial region 11pb. The third electrode 23 is electrically connected to the third partial region 11pc. The direction from the first partial region 11pa toward the first electrode 21 is aligned with the first direction (e.g., the Z-axis direction).

At least a portion of the first insulating film 31 is provided between the first partial region 11pa and the first electrode 21. For example, the first insulating film 31 contacts the first semiconductor layer 11.

The second semiconductor layer 12 includes, for example, a nitride semiconductor. In the example, the second semiconductor layer 12 includes $Al_{x2}Ga_{1-x2}N$ ($0 < x2 \leq 1$ and $x1 < x2$). For example, the composition ratio of Al included in the second semiconductor layer 12 is higher than the composition ratio of Al included in the first semiconductor layer 11. The first semiconductor layer 11 may not include Al.

In the example, a portion of the second semiconductor layer 12 is positioned between the second electrode 22 and a portion of the first electrode 21 in the second direction (the X-axis direction). A portion of the second semiconductor layer 12 is positioned between the third electrode 23 and a portion of the first electrode 21 in the second direction (the X-axis direction).

The first electrode 21 is, for example, a gate electrode. The second electrode 22 is, for example, a source electrode. The third electrode 23 is, for example, a drain electrode. The semiconductor device 110 is, for example, a GaN-MOSFET. The semiconductor device 110 is a normally-off transistor.

The first electrode 21 includes, for example, at least one selected from the group consisting of Al, TiN, TiW, W, and polysilicon. At least one of the second electrode 22 or the third electrode 23 includes, for example, Ti and Al. At least one of the second electrode 22 or the third electrode 23 includes, for example, a stacked film including a Ti film and an Al film.

The first insulating film 31 functions as, for example, a gate insulating film. The first insulating film 31 has a first thickness t1 (referring to FIG. 2). The first thickness t1 is the thickness (the length) in the first direction of the first insulating film 31.

Other than silicon and oxygen, there are cases where the first insulating film 31 includes hydrogen, fluorine, and nitrogen. There are cases where at least some of these elements affect the instability of the threshold voltage of the semiconductor device 110.

FIG. 1A to FIG. 1C respectively illustrate the concentration distributions of hydrogen, fluorine, and nitrogen of the semiconductor device 110 according to the embodiment. These are SIMS (Secondary Ion Mass Spectrometry) analysis results of the semiconductor device 110. In the analysis results, the values that are shown are quantified using the detection sensitivity of the first insulating film 31. The SIMS analysis is performed using $Cs^+$ ions. In the SIMS analysis, the acceleration voltage is 2.0 kV. In these figures, the horizontal axis is a position pZ in the Z-axis direction. The position where the position pZ is 0 substantially corresponds to, for example, the interface between the first insulating film 31 and the first semiconductor layer 11. The vertical axis of FIG. 1A is a concentration C(H) of hydrogen (H) (atoms/cm$^3$). The vertical axis of FIG. 1B is a concentration C(F) of fluorine (F) (atoms/cm$^3$). The vertical axis of FIG. 1C is a concentration C(N) of nitrogen (N) (atoms/cm$^3$). In the example, the first thickness t1 of the first insulating film 31 is 30 nm. These analysis results correspond to the characteristics of a sample SP04 described below.

As shown in FIG. 1C, a stacked region R1 that includes the first semiconductor layer 11 and the first insulating film 31 includes a nitrogen peak position. The nitrogen peak position is a fourth position p4 shown in FIG. 1C. The concentration of nitrogen in the stacked region R1 has a peak at the nitrogen peak position (the fourth position p4). The fourth position p4 (the nitrogen peak position) substantially corresponds to the position of the interface between the first insulating film 31 and the first semiconductor layer 11.

As shown in FIG. 1A, the first insulating film 31 includes a first position p1. The distance between the first position p1 and the first semiconductor layer 11 is ½ of the first thickness t1. The first position p1 is, for example, the position of the center of the first insulating film 31 in the Z-axis direction. A first hydrogen concentration C1(H) of hydrogen at the first position p1 is $2.5 \times 10^{19}$ atoms/cm$^3$ or less.

The first insulating film 31 further includes a second position p2. A second hydrogen concentration C2(H) of hydrogen at the second position p2 is the peak of the concentration C(H) of hydrogen in the region between the first position p1 and the first semiconductor layer 11. Thus, the concentration C(H) of hydrogen has a peak at a portion of the first insulating film 31 on the first semiconductor layer 11 side. The position of the peak is the second position p2. The distance along the Z-axis direction between the second position p2 and the fourth position p4 is 10 nm or less. The distance corresponds to the distance (the length along the Z-axis direction) between the second position p2 and the first semiconductor layer 11. The distance may be 8 nm or less. The distance may be 5 nm or less. Thus, the concentration C(H) of hydrogen has a peak at the vicinity (the second position p2) of the interface between the first insulating film 31 and the first semiconductor layer 11.

The second hydrogen concentration C2(H) at the second position p2 is $3 \times 10^{21}$ atoms/cm$^3$ or less. In the example, the second hydrogen concentration C2(H) is $2 \times 10^{19}$ atoms/cm$^3$ or more.

The first hydrogen concentration C1(H) is not more than 0.041 times the second hydrogen concentration C2(H). In other words, the second hydrogen concentration C2(H) is not less than 24.2 times the first hydrogen concentration C1(H).

Thus, in the embodiment, the concentration C(H) of hydrogen is low at the central vicinity (the first position p1) in the thickness direction of the first insulating film 31. Also, the peak (the second hydrogen concentration C2(H)) of the concentration (H) of hydrogen is low at the vicinity (the second position p2) of the interface between the first insulating film 31 and the first semiconductor layer 11.

Here, the second hydrogen concentration C2(H) is somewhat high. In other words, as described above, the second hydrogen concentration C2(H) is not less than 24.2 times the first hydrogen concentration C1(H). Thus, the concentration C(H) of hydrogen has a unique distribution.

On the other hand, as shown in FIG. 1B, the concentration C(F) of fluorine (i.e., the first fluorine concentration C1(F)) at the first position p1 is $4 \times 10^{16}$ atoms/cm$^3$ or less. The first fluorine concentration C1(F) may be less than $1 \times 10^{16}$ atoms/cm$^3$. The second fluorine concentration C2(F) of fluorine at the second position p2 is $3.5 \times 10^{17}$ atoms/cm$^3$ or less. The first fluorine concentration C1(F) of fluorine at the first position p1 is not more than 0.36 times the second fluorine concentration C2(F) at the second position p2. In other words, the second fluorine concentration C2(F) is not less than 2.7 times the first fluorine concentration C1(F).

The peak of the concentration C(F) of fluorine will now be focused upon. As shown in FIG. 1B, the first insulating film 31 includes a third position p3. The third fluorine concentration of fluorine at the third position p3 is the peak of the concentration C(F) of fluorine in a region between the first position p1 and the first semiconductor layer 11. The distance along the Z-axis direction between the third position p3 and the fourth position p4 is 10 nm or less. The distance may be 8 nm or less. The distance may be 5 nm or less. In the example, the third position p3 is substantially the same as the second position p2. Accordingly, the third fluorine concentration is substantially the same as the second fluorine concentration C2(F). The first fluorine concentration C1(F) is not more than 0.36 times the third fluorine concentration (in the example, the second fluorine concentration C2(F)).

Thus, in the embodiment, the concentration C(F) of fluorine is low at the central vicinity (the first position p1) in the thickness direction of the first insulating film 31. Also, the peak (the second fluorine concentration C2(F)) of the concentration C(F) of fluorine at the vicinity (the second position p2) of the interface between the first insulating film 31 and the first semiconductor layer 11 is low.

Here, the second fluorine concentration C2(F) is somewhat high. In other words, as described above, the second fluorine concentration C2(F) is not less than 2.7 times the first fluorine concentration C1(F). Thus, the concentration C(F) of fluorine has a unique distribution.

As shown in FIG. 1C, a concentration C(N) of nitrogen at the first position p1 is $1 \times 10^{19}$ atoms/cm$^3$ or less. On the other hand, as described above, the concentration C(N) of nitrogen has a peak at the fourth position p4 (the nitrogen peak position). The peak value of the concentration C(N) of nitrogen is not less than $5 \times 10^{22}$ atoms/cm$^3$ and not more than $5 \times 10^{23}$ atoms/cm$^3$.

As shown in FIG. 1A to FIG. 1C, the second position p2 and the third position p3 are between the first position p1 and the fourth position p4 (the position of the peak of the concentration C(N) of nitrogen). The second position p2 and the third position p3 are at a position where the concentration C(N) of nitrogen is low. The ratio of the difference between the concentration C(N) of nitrogen at the second position p2 (or the third position p3) and the concentration C(N) of nitrogen at the first position p1 to the concentration C(N) of nitrogen at the first position p1 is 0.001 or less.

Thus, the first insulating film 31 of the semiconductor device 110 according to the embodiment has a special profile relating to the concentrations of the elements. By such a configuration, for example, the instability of the threshold voltage of the semiconductor device 110 is suppressed. A semiconductor device and an electrical device can be provided in which it is possible to further stabilize the threshold voltage. According to the embodiment, a semiconductor device and an electrical device can be provided in which the operations can be stabilized.

Examples of characteristics of the semiconductor device will now be described. The inventor of the application made samples using various manufacturing conditions. A PBTI (Positive Bias Temperature Instability) test is performed for these samples. Then, the difference between the initial value and the value corresponding to the threshold voltage after the PBTI test is evaluated.

For the samples, designated elements (e.g., impurities) inside the first insulating film 31 are focused upon. For example, the first insulating film 31 is formed using ALD (Atomic Layer Deposition), etc. It is considered that the characteristics (e.g., the impurities) of the first insulating film 31 that is formed change due to the source materials used in the film formation. Further, it is considered that the characteristics (e.g., the impurities) of the first insulating film 31 change due to the heat treatment after the first insulating film 31 is formed. For example, it is considered that the temperature of the heat treatment, the time of the heat treatment, the atmosphere of the heat treatment, etc., affect the characteristics (e.g., the impurities) of the first insulating film 31.

In the experiment, various samples are made in which the construction conditions are modified; and the voltage change after the PBTI test is evaluated. The experimental results will now be described.

A thickness t1 of the first insulating film 31 is 30 nm in the samples SP01 to SP04. In the samples SP01 to SP04, the manufacturing conditions (including the heat treatment conditions) of the first insulating film 31 are different from each other. The PBTI test is performed for these samples. In the PBTI test, a prescribed positive direct current voltage is applied to the first electrode 21; and the relationship between the voltage change and the application time of the voltage is evaluated.

Figure 3:
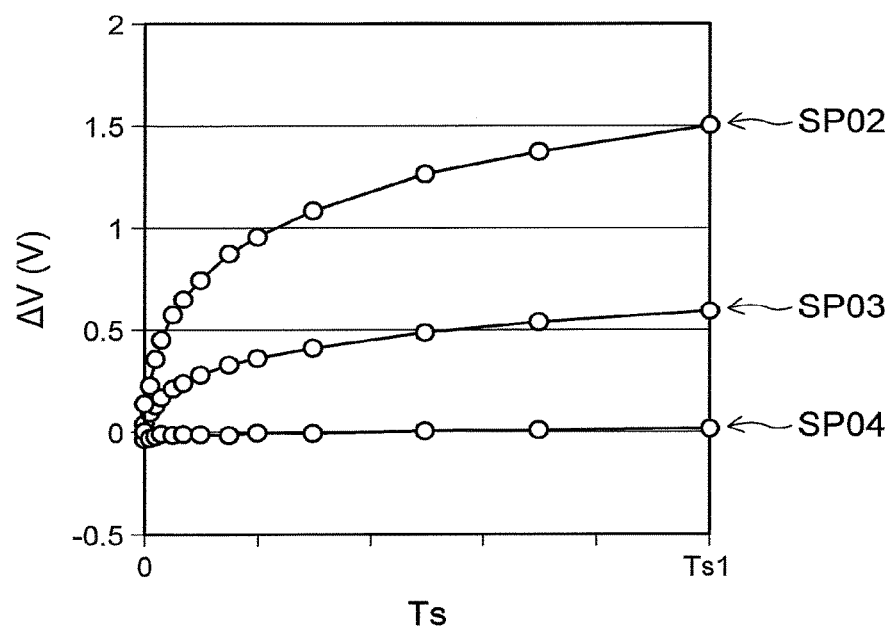
FIG. 3 is a graph illustrating the experimental results relating to the semiconductor device.

FIG. 3 is a graph illustrating the experimental results relating to the semiconductor device.

The semiconductor device is a capacitor.

A capacitance is formed by the first semiconductor layer 11, the first insulating film 31, and the first electrode 21. The capacitance changes according to the voltage applied to the first electrode 21. For the electrical capacitance-voltage characteristic (the C-V characteristic), the applied voltage that causes a constant electrical capacitance is taken as the "designated voltage of the C-V characteristic." The change of the threshold voltage of the semiconductor device (e.g., the transistor) in the PBTI test corresponds to the change of the "designated voltage of the C-V characteristic." Accordingly, the change of the threshold voltage of the semiconductor device (e.g., the transistor) in the PBTI test can be evaluated by the evaluation of the change of the "designated voltage of the C-V characteristic." For example, there are cases where the evaluation of the threshold voltage of the transistor is affected by the residual elements of the patterning processes of the electrode, etc. On the other hand, the evaluation is possible in a state in which there are no effects from the residual elements caused by the other processes because the formation of a complex structure (source/drain electrodes, etc.) and the like are omissible when evaluating the change of the "designated voltage of the C-V characteristic."

FIG. 3 shows an example of the results of the PBTI test of the samples. The horizontal axis of FIG. 3 is an application time Ts of the bias voltage of the PBTI test. The vertical axis of FIG. 3 is a voltage change $\Delta V$ (volts (V)).

As shown in FIG. 3, in the sample SP04, the voltage change $\Delta V$ is 0.02 V or less and is extremely small. In the sample SP03, the voltage change $\Delta V$ is about 0.6 V when a prescribed amount of time Ts1 has elapsed. In the sample SP02, the voltage change $\Delta V$ is about 1.5 V when the prescribed amount of time Ts1 has elapsed.

In the case where the first insulating film 31 having conditions similar to those of the sample SP03 is used in a silicon semiconductor device, the voltage change $\Delta V$ is about 0.05 V and is relatively small when the prescribed amount of time Ts1 has elapsed. When using the first insulating film 31 having the same conditions, the voltage change $\Delta V$ of a nitride semiconductor device is markedly large compared to the voltage change $\Delta V$ of the silicon semiconductor device.

In the sample SP04, the threshold voltage substantially does not fluctuate even though a nitride semiconductor is used. In the sample SP04, the voltage change $\Delta V$ is smaller than conventionally obtained.

Thus, different voltage changes $\Delta V$ are obtained for different construction conditions of the samples. By analyzing the samples, it is considered that the difference between the voltage changes $\Delta V$ is dependent on the concentration distribution of the designated elements included inside the first insulating film 31.

Figure 4A:
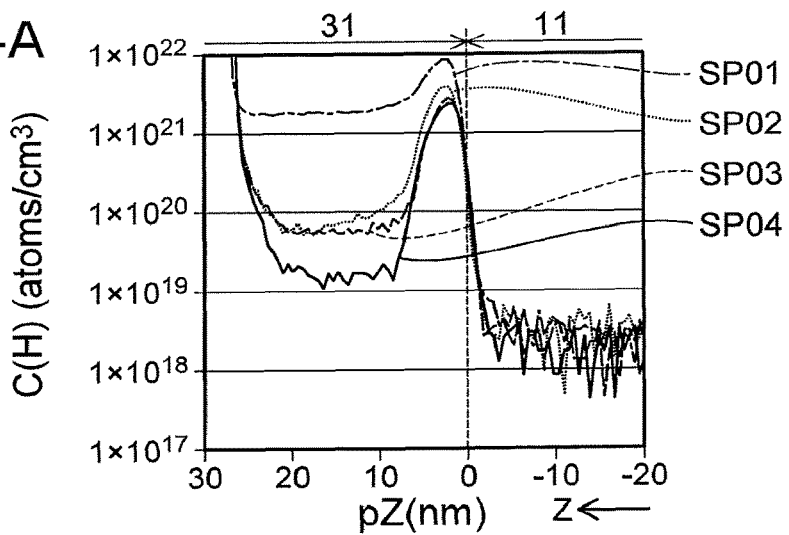
FIG. 4A to FIG. 4C are graphs illustrating the analysis results of the experiment samples.
Figure 4B:
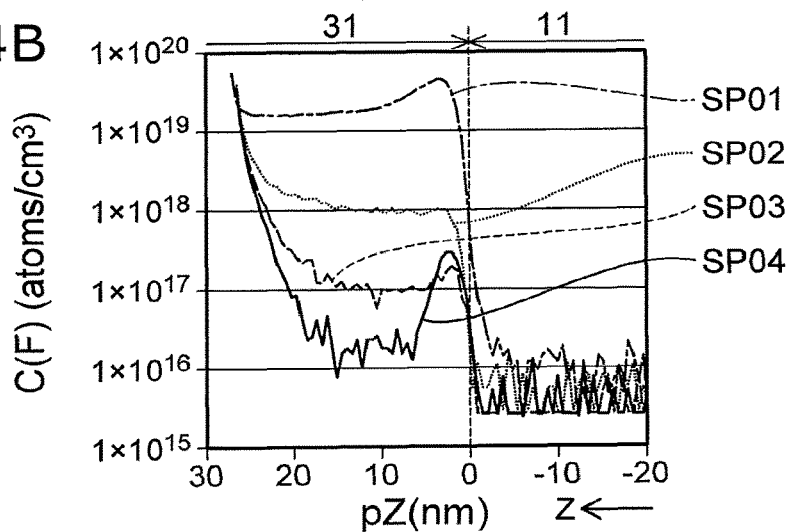
Figure 4C:
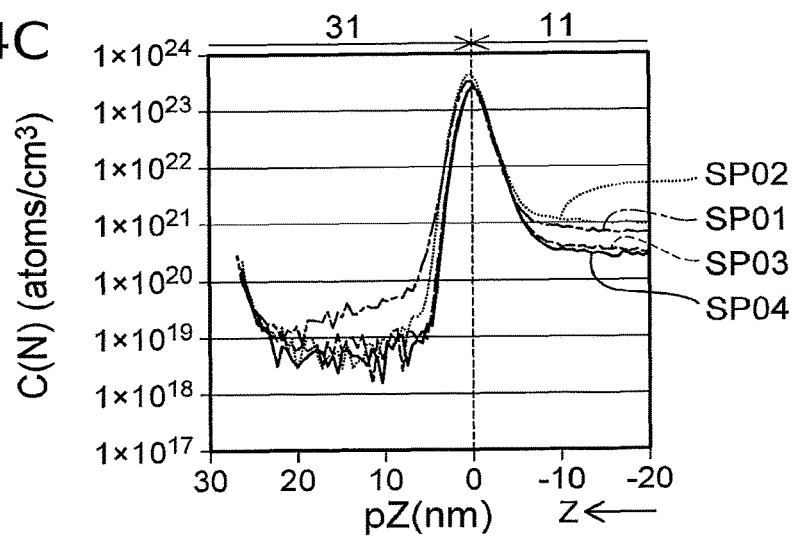

FIG. 4A to FIG. 4C are graphs illustrating the analysis results of the experiment samples.

These figures illustrate the SIMS analysis results of the sample SP01 to the sample SP04. In these figures, the horizontal axis is the position pZ in the Z-axis direction. The vertical axis of FIG. 4A is the concentration C(H) of hydrogen (H) (atoms/cm$^3$). The vertical axis of FIG. 4B is the concentration C(F) of fluorine (F) (atoms/cm$^3$). The vertical axis of FIG. 4C is the concentration C(N) of nitrogen (N) (atoms/cm$^3$).

For the sample SP01 in which the voltage change $\Delta V$ is extremely large, both the concentration C(H) of hydrogen and the concentration C(F) of fluorine are extremely high at a position pZ of about 15 nm (corresponding to the first position p1). Compared to the samples SP02, SP03, and SP04, it can be seen that the voltage change $\Delta V$ is small if the concentrations of these elements are low.

The sample SP03 and the sample SP04 are compared. Peaks occur at a position of about 3 nm (corresponding to the second position p2) for both the concentration C(H) of hydrogen and the concentration C(F) of fluorine. For both hydrogen and fluorine, the peak concentration of the sample SP03 is substantially the same as the peak concentration of the sample SP04. On the other hand, the concentrations at a position of about 15 nm (corresponding to the first position p1) are much different between the sample SP03 and the sample SP04.

In other words, for the sample SP04 in which the voltage change $\Delta V$ is small, the concentration C(H) of hydrogen at the position of about 15 nm (corresponding to the first position p1) is markedly low compared to the peak concentration (the concentration of hydrogen at the position of about 3 nm, i.e., the second position p2). Similarly, for the sample SP04, the concentration C(F) of fluorine at the position of about 15 nm (corresponding to the first position p1) is markedly low compared to the peak concentration (the concentration of fluorine at the position of about 3 nm, i.e., the second position p2).

On the other hand, as shown in FIG. 4B, the concentration C(F) of fluorine at the position of about 3 nm (corresponding to the second position p2) for the sample SP03 is lower than the concentration C(F) of fluorine at the position of about 3 nm (corresponding to the second position p2) for the sample SP04. It is a notable phenomenon that the peak concentration at the vicinity of the interface is higher for the sample SP04 in which the voltage change $\Delta V$ is markedly small than for the sample SP03.

From the description recited above, it is considered that the voltage change $\Delta V$ has a relationship with both the concentrations of the elements at the central vicinity of the first insulating film 31 and the concentrations of the elements at the vicinity of the interface between the first insulating film 31 and the first semiconductor layer 11 (e.g., at a position pZ of 0 nm to 10 nm).

As in the samples SP01 and SP02, the voltage change $\Delta V$ is large if the concentrations of the elements at the vicinity of the interface between the first insulating film 31 and the first semiconductor layer 11 (e.g., at a position pZ of 0 nm to 10 nm) are excessively high. Also, as in the samples SP01 and SP02, the voltage change $\Delta V$ is large if the concentrations of the elements at the central vicinity (the first position p1) of the first insulating film 31 are excessively high. The voltage change $\Delta V$ is small if the concentrations of the elements at the vicinity of the interface between the first insulating film 31 and the first semiconductor layer 11 are somewhat low and the concentrations of the elements at the central vicinity of the first insulating film 31 are somewhat low. For example, the case where such conditions are satisfied corresponds to the sample SP03. The voltage change $\Delta V$ of the sample SP03 is about 0.6 V and is low (referring to FIG. 3).

However, the state of the sample SP03 is insufficient to further reduce the voltage change $\Delta V$. For example, as in the sample SP04, the concentrations of the elements at the vicinity of the interface between the first insulating film 31 and the first semiconductor layer 11 (e.g., the second position p2) are set to be not more than a constant but are maintained to be not less than a constant. In other words, the concentrations of the elements at the vicinity (the second position p2) of the interface between the first insulating film 31 and the first semiconductor layer 11 are maintained to be about the values of the sample SP04. Also, at this time, the concentrations of the elements at the central vicinity of the first insulating film 31 are set to be sufficiently low.

It is considered that the voltage change $\Delta V$ obtained by such a unique profile is smaller than could be easily obtained conventionally.

For example, it is considered that the density of the traps formed by these elements is suppressed by setting the concentrations of the elements (hydrogen and fluorine) at the central vicinity of the first insulating film 31 to be sufficiently low. On the other hand, it is considered that the local defects of the surface of the GaN of the first semiconductor layer 11 are reduced by, for example, at least some amount of hydrogen existing at the vicinity (the second position p2) of the interface between the first insulating film 31 and the first semiconductor layer 11. It is considered that the extremely small voltage change ΔV is obtained for the sample SP04 due to two such types of effects.

As described above, the concentrations of the elements such as hydrogen, fluorine, etc., included in the first insulating film 31 are affected not only by the raw materials but also the heat treatment after the first insulating film 31 is formed, etc. For example, the concentrations of these elements are low if the temperature of the heat treatment is high. For example, the concentrations of these elements are low if the time of the heat treatment is long. The concentration of hydrogen of the first insulating film 31 is not sufficiently low if the atmosphere of the heat treatment includes hydrogen. For example, the concentrations of these elements are reduced easily by performing the heat treatment in an inert gas atmosphere such as nitrogen, etc. For example, it is desirable for the concentration of nitrogen in the atmosphere of the heat treatment to be 80% or more. The atmosphere of the heat treatment may be an atmosphere including nitrogen and oxygen. The heat treatment may be performed in a reduced-pressure state. There are also cases where these elements are included in the first insulating film 31 due to contamination from the heat treatment apparatus and the film formation apparatus of the first insulating film 31. It is easy to obtain the first insulating film 31 in which the concentrations of these elements are low by appropriately controlling these devices.

An example of the relationship between the conditions of the heat treatment and the concentrations of hydrogen and fluorine will now be described. An example of the first hydrogen concentration C1(H) at the first position p1 and the first fluorine concentration C1(F) at the first position p1 will now be described.

Figure 5A:
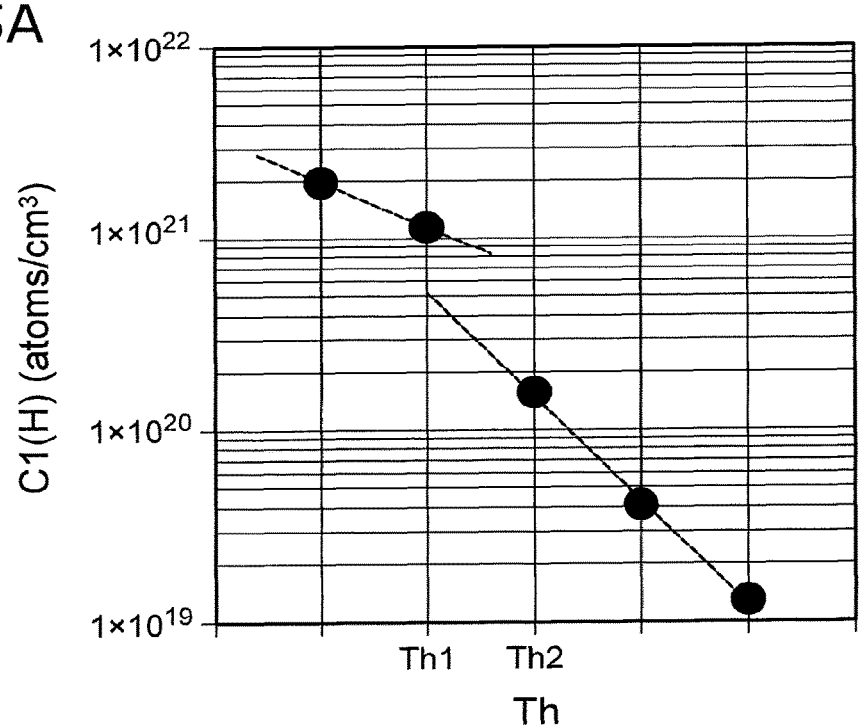
FIG. 5A and FIG. 5B are graphs illustrating the experimental results.
Figure 5B:
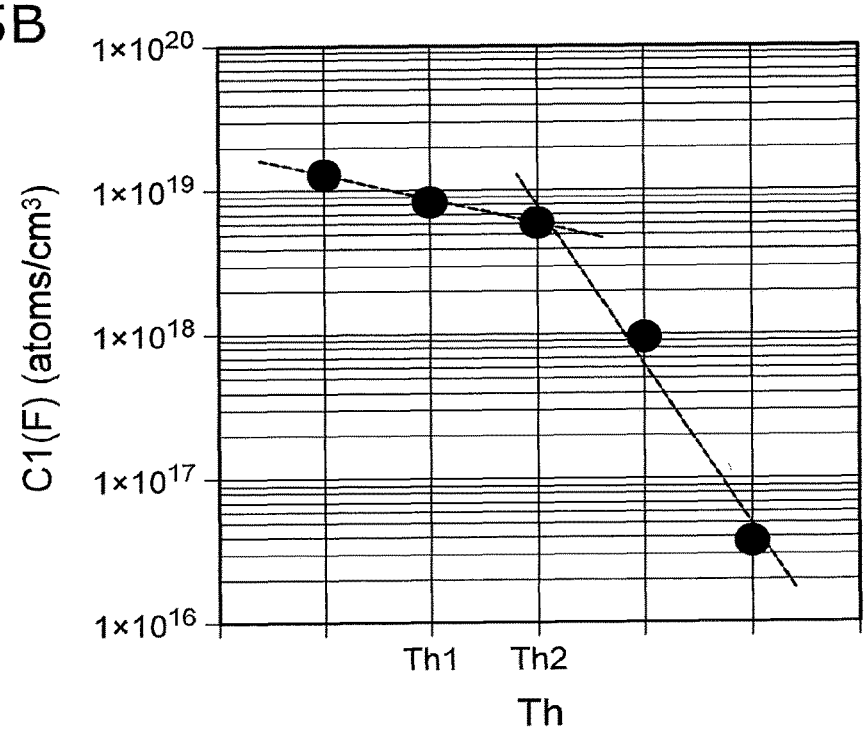

FIG. 5A and FIG. 5B are graphs illustrating the experimental results.

These figures illustrate the concentrations of the elements when modifying the temperature of the heat treatment performed after forming the first insulating film 31. In these figures, the horizontal axis is a temperature Th of the heat treatment. The vertical axis of FIG. 5A is the first hydrogen concentration C1(H). The vertical axis of FIG. 5B is the first fluorine concentration C1(F). For the samples shown in these figures, the conditions of the film formation of the first insulating film 31 are the same; and the atmosphere and time of the heat treatment are the same.

As shown in FIG. 5A and FIG. 5B, the first hydrogen concentration C1(H) and the first fluorine concentration C1(F) decrease as the temperature Th of the heat treatment increases.

As shown in FIG. 5A, the degree of the change of the concentration of hydrogen is different between being lower than a designated temperature Th1 and being higher than the temperature Th1. For example, it is considered that the difference between being lower than the designated temperature Th1 and being higher than the temperature Th1 is caused by the efficiency of removing the hydrogen from the first insulating film 31.

As shown in FIG. 5B, the degree of the change of the concentration of fluorine is different between being lower than a designated temperature Th2 and being higher than the temperature Th2. For example, it is considered that the difference between being lower than the designated temperature Th2 and being higher than the temperature Th2 is caused by the efficiency of removing the fluorine from the first insulating film 31.

It is favorable for the temperature of the heat treatment to be higher than the temperature Th1 and higher than the temperature Th2. For example, the temperatures Th1 and Th2 recited above, etc., can be known by performing the heat treatment at various temperatures and by measuring the degree of the change of the elements at that time.

On the other hand, a nitride semiconductor (e.g., GaN, etc.) is crystal grown at about 1000° C. It is favorable for the temperature of the heat treatment after forming the first insulating film 31 to be lower than the temperature of the crystal growth. The nitride semiconductor may be damaged if the temperature of the heat treatment is excessively high.

Figure 6A:
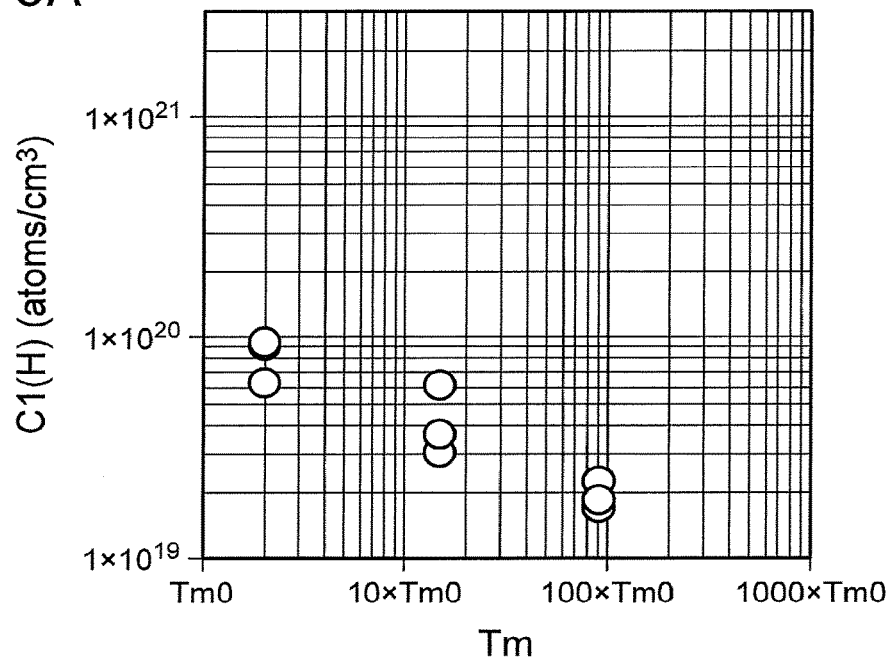
FIG. 6A and FIG. 6B are graphs illustrating the experimental results.
Figure 6B:
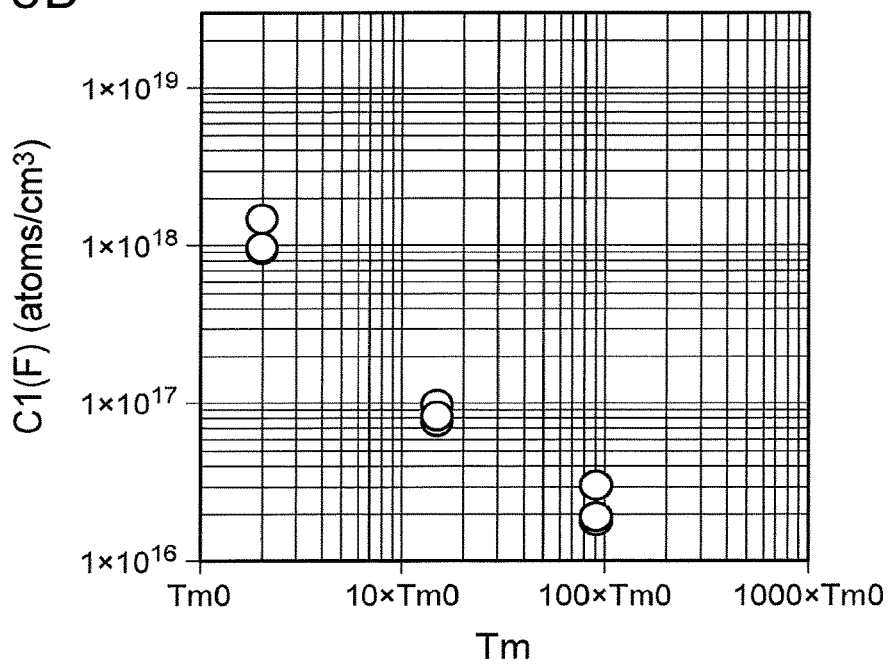

FIG. 6A and FIG. 6B are graphs illustrating the experimental results.

These figures illustrate the concentrations of the elements when the time of the heat treatment performed after forming the first insulating film 31 is modified. In these figures, the horizontal axis is a time Tm of the heat treatment. The horizontal axis is logarithmic. The horizontal axis is displayed using a designated "unit time Tm0" as a reference. The vertical axis of FIG. 6A is the first hydrogen concentration C1(H). The vertical axis of FIG. 6B is the first fluorine concentration C1(F). For the samples shown in these figures, the conditions of the film formation of the first insulating film 31 are the same; and the atmosphere and temperature of the heat treatment are the same.

As shown in FIG. 6A and FIG. 6B, the first hydrogen concentration C1(H) and the first fluorine concentration C1(F) decrease as the time Tm of the heat treatment is set to be longer.

By considering characteristics such as those recited above, the conditions relating to the film formation of the first insulating film 31 and the heat treatment after the film formation can be determined appropriately.

FIG. 7A to FIG. 7D and FIG. 8A to FIG. 8D are graphs illustrating the experimental results.

Figure 7A:
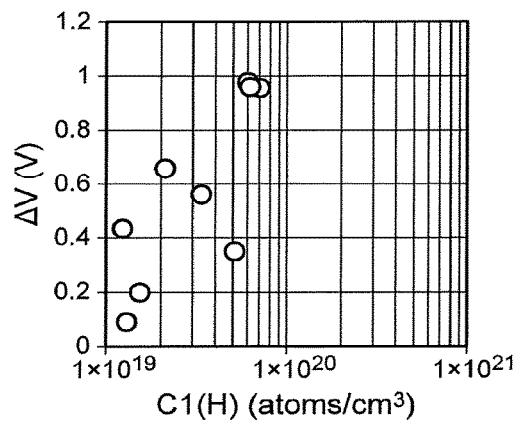
FIG. 7A to FIG. 7D are graphs illustrating the experimental results.
Figure 7B:
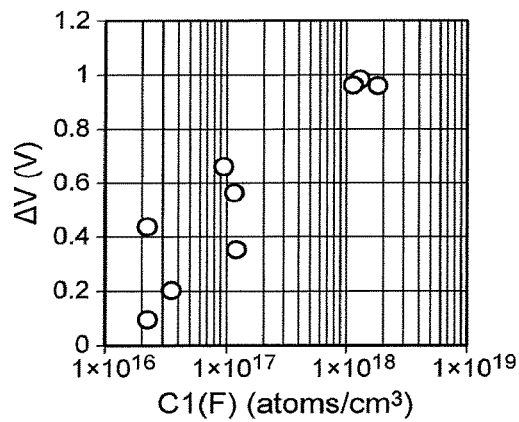
Figure 7C:
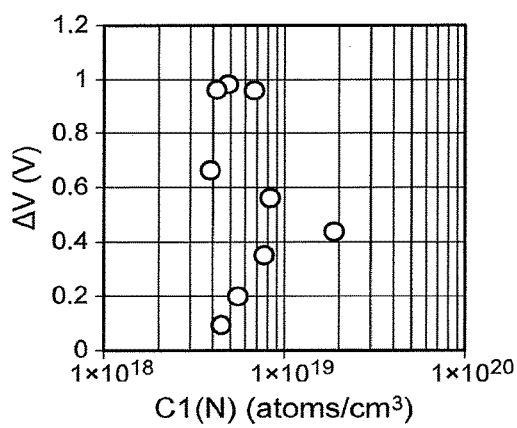
Figure 7D:
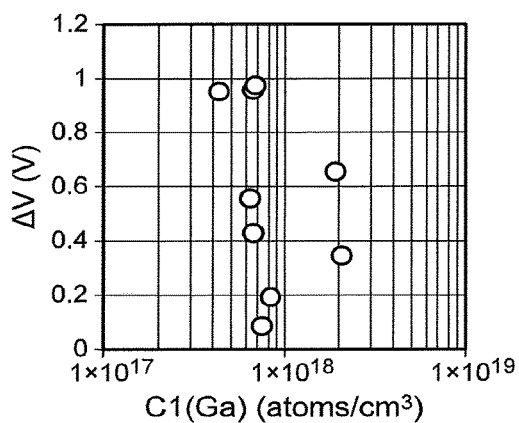

These figures illustrate the experimental results of the relationship between the voltage change ΔV and the elements inside the first insulating film 31 for samples of various conditions. In these figures, the vertical axis is the voltage change ΔV of the PBTI test. In FIG. 7A and FIG. 8A, the horizontal axis is the first hydrogen concentration C1(H) at the first position p1 (the center in the thickness direction of the first insulating film 31). In FIG. 7B and FIG. 8B, the horizontal axis is the first fluorine concentration C1(F) at the first position p1. In FIG. 7C and FIG. 8C, the horizontal axis is a nitrogen concentration C1(N) at the first position p1. In FIG. 7D and FIG. 8D, the horizontal axis is a gallium concentration C1(Ga) at the first position p1.

The first thickness t1 of the first insulating film 31 is 30 nm in FIG. 7A to FIG. 7D. The first thickness t1 of the first insulating film 31 is 10 nm in FIG. 8A to FIG. 8D.

It can be seen from these figures that the voltage change ΔV has a correlation with the first hydrogen concentration C1(H) and the first fluorine concentration C1(F). On the other hand, a distinct correlation is not confirmed between the voltage change ΔV and the concentrations of the other elements (nitrogen and gallium).

The voltage change ΔV is normalized using the first thickness t1. Namely, a normalized voltage change ΔVn (volt/nanometer) is the voltage change ΔV per the first thickness t1 (units: nanometers).

Based on FIG. 7A and FIG. 8A, the following first formula can be derived for the normalized voltage change ΔVn and the first hydrogen concentration C1(H) (1/cm³).

$$\Delta Vn = 0.0298 \cdot \log_{10}(C1(H)) - 0.5634 \quad (1)$$

Based on FIG. 7B and FIG. 8B, the following second formula can be derived for the normalized voltage change ΔVn and the first fluorine concentration C1(F) (1/cm³).

$$\Delta Vn = 0.0207 \cdot \log_{10}(C1(F)) - 0.3368 \quad (2)$$

It is desirable to control the concentrations to be lower than the first hydrogen concentration C1(H) of the first formula recited above and the first fluorine concentration C1(F) of the second formula recited above. Thereby, the desired small normalized voltage change ΔVn is obtained.

Figure 9:
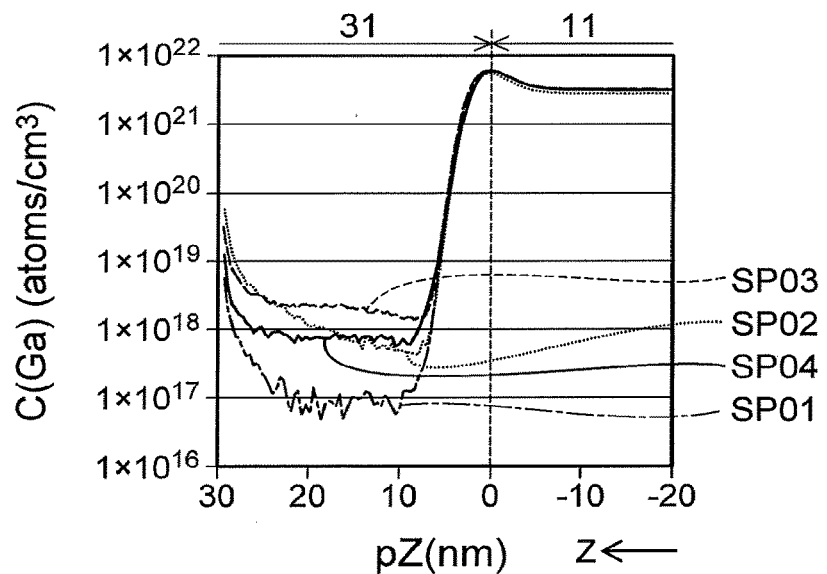
FIG. 9 is a graph illustrating analysis results of the experiment samples.

FIG. 9 is a graph illustrating analysis results of the experiment samples.

FIG. 9 illustrates the concentration distribution of gallium for the samples SP01 to SP04 recited above. FIG. 9 is the SIMS analysis results of gallium. In the analysis results, the values that are shown are quantified using the detection sensitivity of the first insulating film 31. The SIMS analysis is performed using $O_2^+$ ions. In the SIMS analysis, the acceleration voltage is 2.0 kV. The horizontal axis of FIG. 9 is the position pZ in the Z-axis direction. The position where the position pZ is 0 substantially corresponds to, for example, the interface between the first insulating film 31 and the first semiconductor layer 11. The vertical axis of FIG. 9 is the concentration C(Ga) of gallium (Ga) (atoms/cm³).

The concentration C(Ga) of gallium at the central vicinity of the first insulating film 31 (e.g., corresponding to the first position p1) is focused upon. The concentration C(Ga) of gallium at the central vicinity of the first insulating film 31 in the samples SP02, SP03, and SP04 is higher than the concentration C(Ga) of gallium at the central vicinity of the first insulating film 31 in the sample SP01. For example, in the fourth sample SP04, the concentration C(Ga) of gallium at the central vicinity of the first insulating film 31 (e.g., corresponding to the first position p1) is $5 \times 10^{17}$ (atoms/cm³) or more.

For example, it is considered that a profile such as that recited above is obtained by the gallium included in the nitride semiconductor (e.g., GaN) diffusing into the first insulating film 31. At this time, as shown in FIG. 4C, the concentration C(N) of nitrogen is low at the central vicinity of the first insulating film 31 (e.g., corresponding to the first position p1). There is a possibility that this is caused by the bonding of the diffused nitrogen and the hydrogen, and by the bonded nitrogen and hydrogen being discharged from the interior of the first insulating film 31. It is considered that nitrogen assists the decrease of the concentrations of hydrogen and fluorine.

Thus, at the central vicinity of the first insulating film 31 (e.g., corresponding to the first position p1), it is considered that the concentrations of hydrogen and fluorine at the first position p1 can be reduced effectively when the concentration C(Ga) of gallium is $5 \times 10^{17}$ (atoms/cm³) or more and the concentration C(N) of nitrogen is $1 \times 10^{19}$ (atoms/cm³) or less.

For example, at the vicinity (the second position p2) of the interface between the first insulating film 31 and the first semiconductor layer 11, it is considered that, for example, the hydrogen and the fluorine terminate a portion of the gallium of the first semiconductor layer 11 from which the nitrogen is detached. It is considered that the surface of the first semiconductor layer 11 is stabilized easily when appropriate concentrations of hydrogen and fluorine exist at the vicinity (the second position p2) of the interface.

For example, there is a possibility that the hydrogen and the fluorine existing at the vicinity (the second position p2) of the interface suppress the density of the traps at the interface vicinity. In the first insulating film 31 that includes silicon and oxygen, the silicon and the nitrogen bond at the interface vicinity. Compared to silicon oxide, silicon nitride traps electrons easily. There is a possibility that the bonding of the silicon and the nitrogen is suppressed by the spatial obstruction due to the hydrogen and the fluorine at the interface vicinity.

Figure 10:
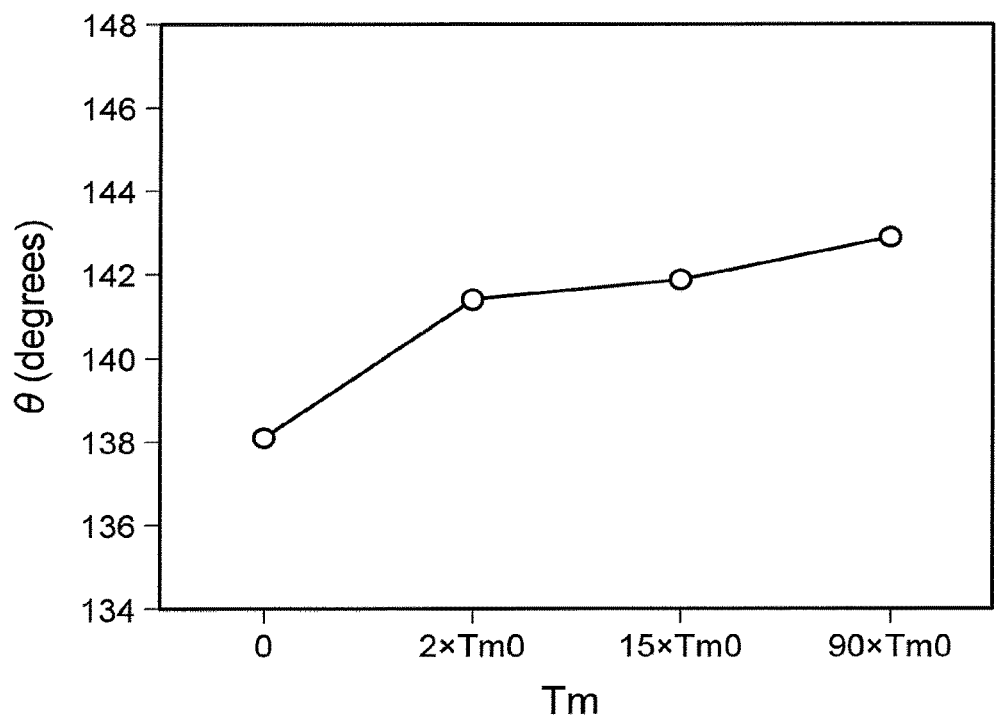
FIG. 10 is a graph illustrating evaluation results of the samples.

FIG. 10 is a graph illustrating evaluation results of the samples.

FIG. 10 shows the change of the Si—O—Si bond angle of the first insulating film 31 when modifying the time Tm of the heat treatment after the film formation of the first insulating film 31. The horizontal axis is the time Tm of the heat treatment. The horizontal axis is displayed using the designated "unit time Tm0" as the reference. The vertical axis of FIG. 10 is a bond angle θ (degrees). The bond angle θ is a value measured by FTIR spectroscopy (Fourier Transform Infra Red Spectroscopy). The bond angle θ in silicon dioxide not including an impurity is known to be about 144 degrees. The sample in which the time Tm is 0 corresponds to the sample SP01 described above.

As shown in FIG. 10, the bond angle θ is small when the time Tm of the heat treatment is short. When the time Tm of the heat treatment is long, the bond angle θ is large and is not less than 142 degrees but less than 144 degrees. In the embodiment, it is favorable for the bond angle θ to be, for example, not less than 142 degrees but less than 144 degrees.

As described above, there is a tendency for the voltage change ΔV to decrease as the time Tm of the heat treatment increases. It is considered that the concentrations of the elements (hydrogen fluorine, etc.) used as the impurities included in the silicon oxide are reduced by increasing the time Tm of the heat treatment. It is considered that the bond angle θ is increased by reducing the concentrations of such elements. At the interface between the first insulating film 31 and the first semiconductor layer 11, the distortion of the silicon oxide is particularly large and affects the voltage change ΔV. For example, it is considered that the distortion of the silicon oxide is compensated by the moderate concentration of hydrogen at the second position p2 of the first insulating film 31. For example, it is considered that the distortion of the silicon oxide is compensated by the moderate concentration of fluorine at the third position p3 of the first insulating film 31. Thereby, it is considered that the effects on the voltage change ΔV caused by the distortion of the silicon oxide are reduced.

Figure 11A:
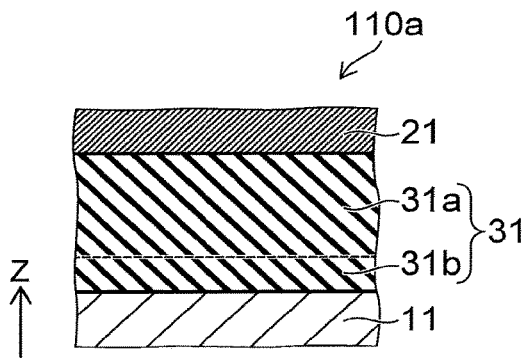
FIG. 11A to FIG. 11C are schematic cross-sectional views illustrating other semiconductor devices according to the first embodiment.
Figure 11B:
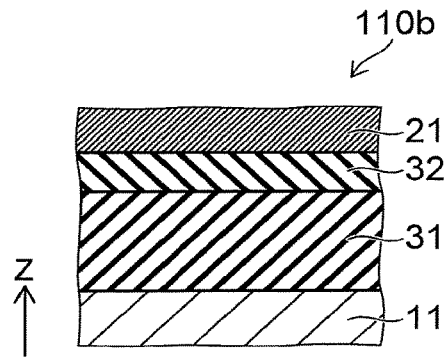
Figure 11C:
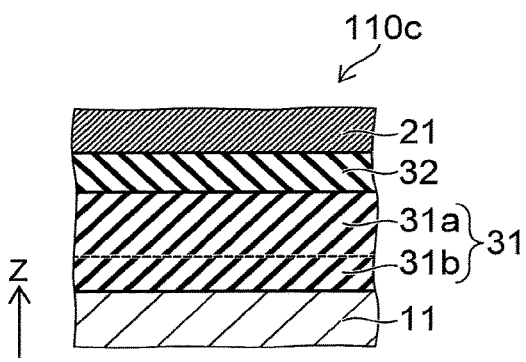

FIG. 11A to FIG. 11C are schematic cross-sectional views illustrating other semiconductor devices according to the first embodiment.

As shown in FIG. 11A to FIG. 11C, semiconductor devices 110a to 110c according to the embodiment also include the first semiconductor layer 11, the first electrode 21, and the first insulating film 31. The second electrode 22 and the third electrode 23 may be provided in these semiconductor devices as well. These electrodes are not illustrated in these drawings.

In the semiconductor device 110a as shown in FIG. 11A, the first insulating film 31 includes a first region 31a and a second region 31b. The second region 31b is positioned between the first region 31a and the first semiconductor layer 11. The thickness (the length in the Z-axis direction) of the second region 31b is not less than 0.2 nm and not more than 3 nm. The boundary between the first region 31a and the second region 31b may not be distinct.

For example, the second region 31b includes nitrogen. On the other hand, the first region 31a does not include nitrogen. Or, the concentration of nitrogen in the first region 31a is lower than the concentration of nitrogen in the second region 31b. For example, the first region 31a is substantially silicon oxide. At least a portion of the second region 31b includes nitrogen. For example, at least a portion of the second region 31b may include a Si—N bond.

The second region 31b may include at least one first element of aluminum or gallium. The first region 31a does not include the first element. Or, the concentration of the first element in the first region 31a is lower than the concentration of the first element in the second region 31b. For example, the first region 31a is substantially silicon oxide. At least a portion of the second region 31b includes the first element. At least a portion of the second region 31b may include a bond between the first element and oxygen. At least a portion of the second region 31b may include a bond between the first element and nitrogen. At least a portion of the second region 31b may include at least one of an Al—O bond, an Al—N bond, a Ga—O bond, or a Ga—N bond.

For example, the second region 31b includes Al and oxygen. The second region 31b may include Al, oxygen, and nitrogen. The second region 31b may include Si and nitrogen. The second region 31b may include Al and nitrogen.

An interface dipole is generated easily in the case where the second region 31b includes Al and oxygen. Thereby, the threshold voltage of the semiconductor device 110a is controlled.

Compared to the case where the second region 31b is not provided, the first thickness t1 of the first insulating film 31 for obtaining the desired electrical characteristics can be set to be thick if the second region 31b includes Al, oxygen, and nitrogen, if the second region 31b includes Si and nitrogen, or if the second region 31b includes Al and nitrogen. By setting the first thickness t1 of the first insulating film 31 to be thick, the effects of the pinholes of the first insulating film 31, etc., that may be formed in the manufacturing processes can be suppressed. There are also cases where the nitrogen that desorbs from the GaN surface is repaired by the second region 31b.

In the case where the second region 31b includes gallium and oxygen, for example, the composition easily changes continuously between the first semiconductor layer 11 and the first insulating film 31. For example, the interface state is lower compared to the case where a discontinuous interface is formed.

In the embodiment, the region between the first insulating film 31 and the first semiconductor layer 11 may include, for example, at least one selected from a second element, oxygen, and nitrogen. The second element includes at least one selected from the group consisting of silicon, aluminum, and gallium. This region between the first insulating film 31 and the first semiconductor layer 11 substantially may not include silicon and substantially may not include oxygen.

As shown in FIG. 11B, the semiconductor device 110b includes a second insulating film 32. Otherwise, the semiconductor device 110b is similar to the semiconductor device 110. The second insulating film 32 is provided between the first insulating film 31 and the first electrode 21. The material included in the second insulating film 32 is different from the material included in the first insulating film 31. For example, the second insulating film 32 includes silicon nitride, silicon oxynitride, or aluminum oxide. Stable characteristics are easier to obtain by using multiple insulating films of different materials.

As shown in FIG. 11C, the first region 31a, the second region 31b, and the second insulating film 32 recited above are provided in the semiconductor device 110c.

FIG. 12 to FIG. 20 are schematic cross-sectional views illustrating other semiconductor devices according to the first embodiment.

Semiconductor devices 111a to 111i shown in FIG. 12 to FIG. 20 also include the first semiconductor layer 11, the first insulating film 31, the first electrode 21, the second electrode 22, and the third electrode 23. A configuration that is similar to those of the semiconductor devices 110 or 110a to 110c is applied to the configuration of the first insulating film 31. The configurations of the semiconductor layers and the electrodes of the semiconductor device will now be described.

Figure 12:
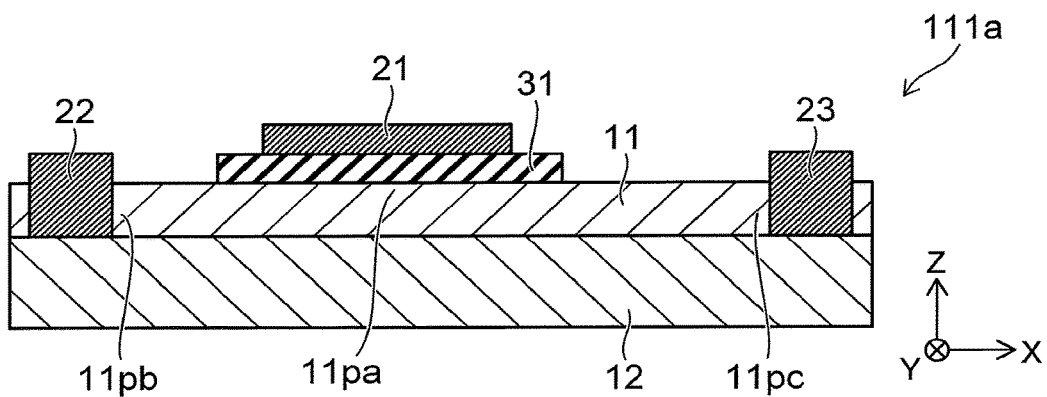
FIG. 12 is a schematic cross-sectional view illustrating the other semiconductor device according to the first embodiment.

In the semiconductor device 111a illustrated in FIG. 12, the first semiconductor layer 11 includes $Al_{x3}Ga_{1-x3}N$ ($0<X3≤1$). The second semiconductor layer 12 includes $Al_{x4}Ga_{1-x4}N$ ($0≤X4<1$ and x4<x3). The first semiconductor layer 11 is provided between the second semiconductor layer 12 and the first electrode 21 in the Z-axis direction. For example, the first insulating film 31 contacts the first semiconductor layer 11. The second electrode 22 is electrically connected to a portion of the first semiconductor layer 11 and a portion of the second semiconductor layer 12. The third electrode 23 is electrically connected to another portion of the first semiconductor layer 11 and another portion of the second semiconductor layer 12. The semiconductor device 111a is, for example, a lateral normally-on HEMT (High Electron Mobility Transistor).

Figure 13:
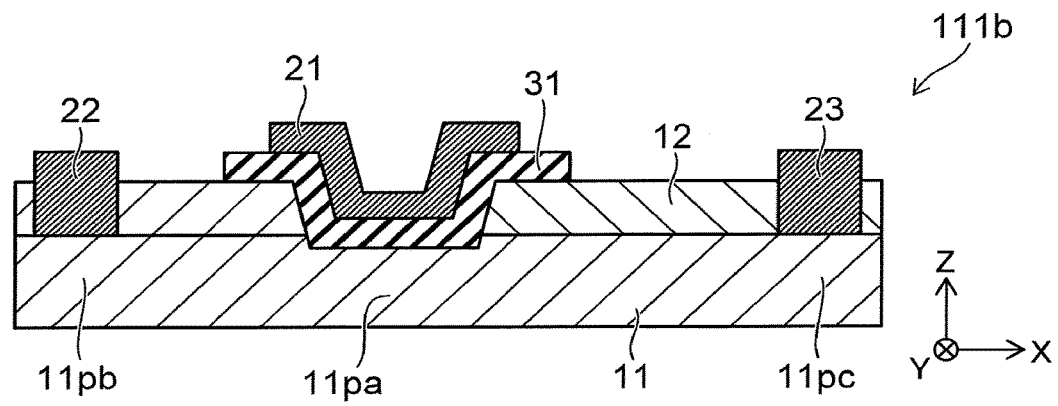
FIG. 13 is a schematic cross-sectional view illustrating the other semiconductor device according to the first embodiment.

In the semiconductor device 111b illustrated in FIG. 13, the first semiconductor layer 11 includes $Al_{x1}Ga_{1-x1}N$ ($0≤X1<1$). The first semiconductor layer 11 is, for example, GaN. The second semiconductor layer 12 includes $Al_{x2}Ga_{1-x2}N$ ($0<X2≤1$ and x1<x2). For example, the first insulating film 31 contacts the first semiconductor layer 11. In the X-axis direction, the first electrode 21 and a portion of the second semiconductor layer 12 overlap; and the first insulating film 31 and a portion of the second semiconductor layer 12 overlap. The semiconductor device 111b is, for example, a lateral normally-off transistor. For example, the GaN layer is a channel in the semiconductor device 111b.

Figure 14:
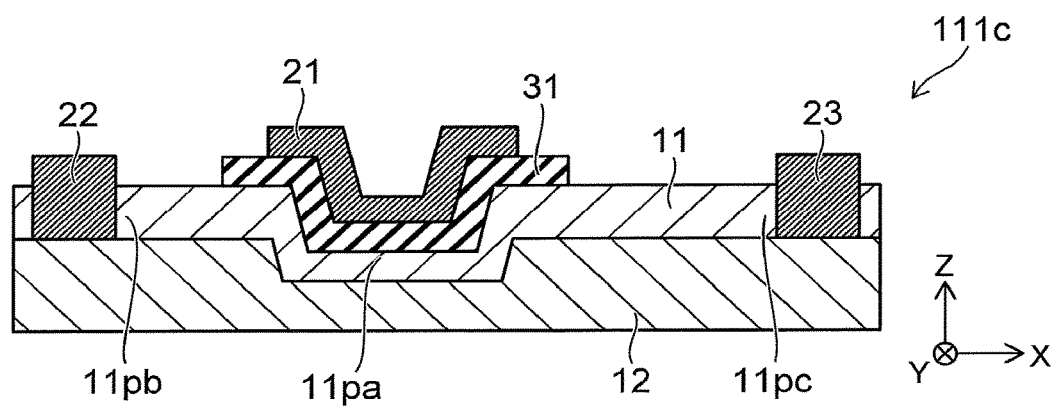
FIG. 14 is a schematic cross-sectional view illustrating the other semiconductor device according to the first embodiment.

In the semiconductor device 111c illustrated in FIG. 14, the first semiconductor layer 11 includes $Al_{x3}Ga_{1-x3}N$ ($0<X3≤1$). The second semiconductor layer 12 includes $Al_{x4}Ga_{1-x4}N$ ($0≤X4<1$ and x4<x3). A portion (the first partial region 11pa) of the first semiconductor layer 11 is provided between the first electrode 21 and a portion of the second semiconductor layer 12 in the Z-axis direction. The semiconductor device 111c is, for example, a lateral normally-off HEMT.

Figure 15:
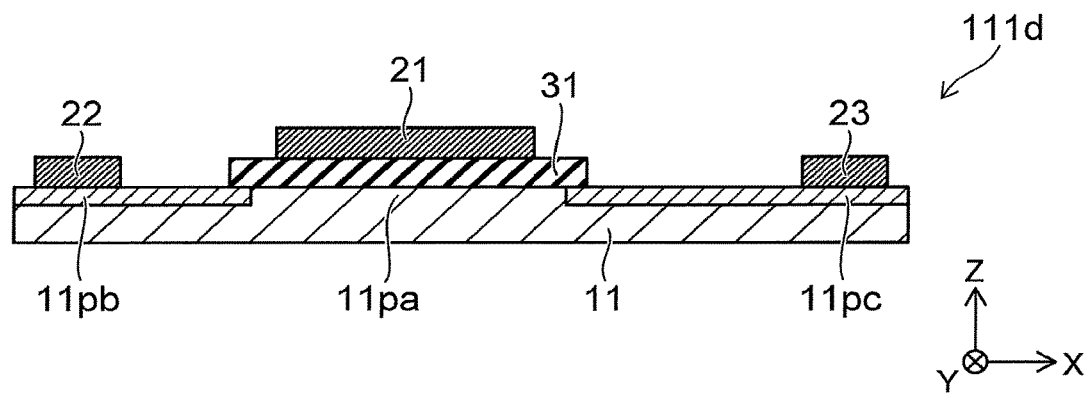
FIG. 15 is a schematic cross-sectional view illustrating the other semiconductor device according to the first embodiment.

In the semiconductor device 111d illustrated in FIG. 15, the first semiconductor layer 11 includes $Al_{x1}Ga_{1-x1}N$ ($0≤X1<1$). The first semiconductor layer 11 is, for example, GaN. The second partial region 11pb and the third partial region 11pc of the first semiconductor layer are, for example, n-type GaN regions. The semiconductor device 111c is an n-type doped normally-off transistor.

Figure 16:
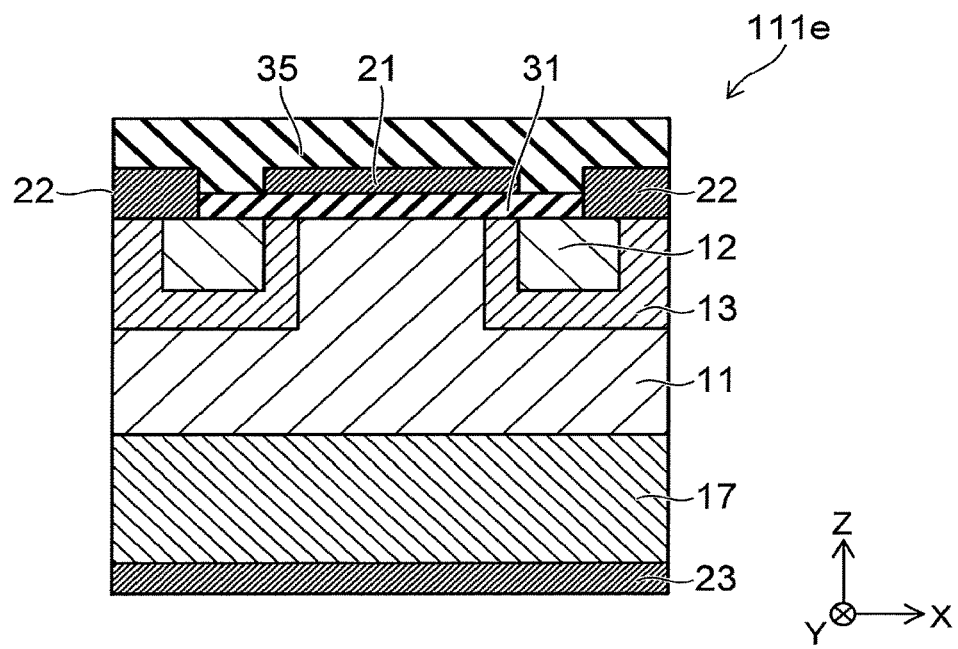
FIG. 16 is a schematic cross-sectional view illustrating the other semiconductor device according to the first embodiment.

In the semiconductor device 111e illustrated in FIG. 16, the direction from the first electrode 21 toward the second electrode 22 crosses the first direction (the Z-axis direction). For example, the direction from the first electrode 21 toward the second electrode 22 is aligned with the X-axis direction. The first semiconductor layer 11 is positioned between the third electrode 23 and the first electrode 21 and between the third electrode 23 and the second electrode 22. The first semiconductor layer 11 is, for example, $Al_{x1}Ga_{1-x1}N$ (0≤X1<1) (e.g., n-type GaN) of a first conductivity type. The second semiconductor layer 12 is provided between the second electrode 22 and a portion of the first semiconductor layer 11. The second semiconductor layer 12 is $Al_{x5}Ga_{1-x5}N$ (0≤X5<1) (e.g., n-type GaN) of the first conductivity type. A third semiconductor layer 13 is provided between the second semiconductor layer 12 and the portion of the first semiconductor layer 11 recited above. The third semiconductor layer 13 is $Al_{x6}Ga_{1-x6}N$ (0≤X6<1) (e.g., p-type GaN) of a second conductivity type. The second electrode 22 is electrically connected to the second semiconductor layer 12. The third electrode 23 is electrically connected to the first semiconductor layer 11. In the example, an n-type GaN layer 17 is provided between the third electrode 23 and the first semiconductor layer 11. The semiconductor device 111e is, for example, a vertical GaN-MOSFET. In the example, a nitride semiconductor (e.g., the n-type GaN layer) of the first conductivity type is provided between the third electrode 23 and the first semiconductor layer 11. In the example, an insulating layer 35 covers the first electrode 21 and the second electrode 22.

Figure 17:
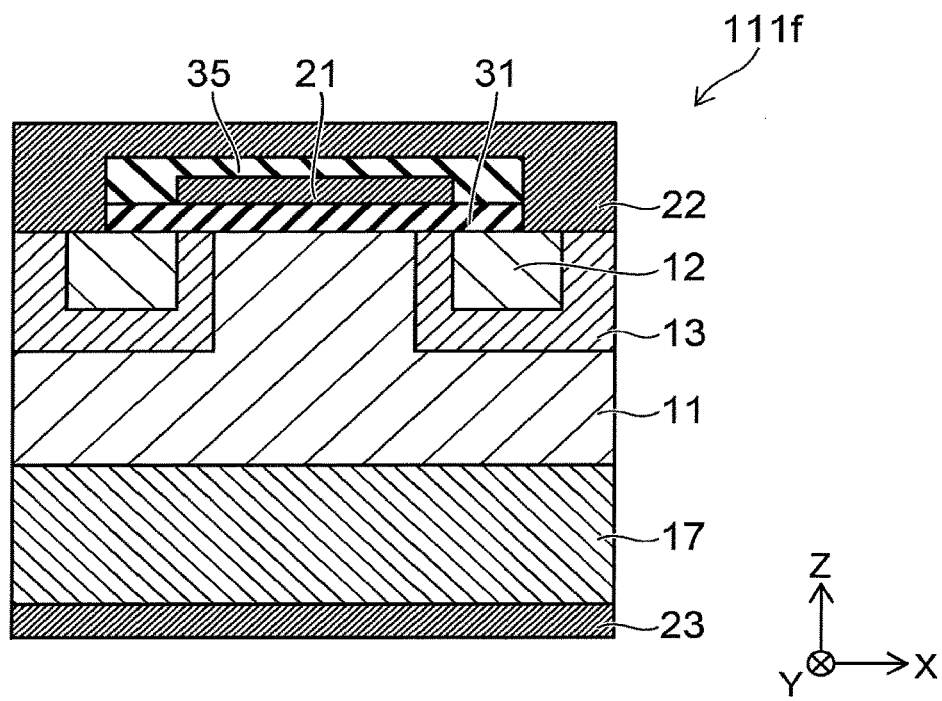
FIG. 17 is a schematic cross-sectional view illustrating the other semiconductor device according to the first embodiment.

In the semiconductor device 111f illustrated in FIG. 17, the insulating layer 35 is provided between the first electrode 21 and a portion of the second electrode 22. Otherwise, the configuration of the semiconductor device 111f is similar to that of the semiconductor device 111e.

Figure 18:
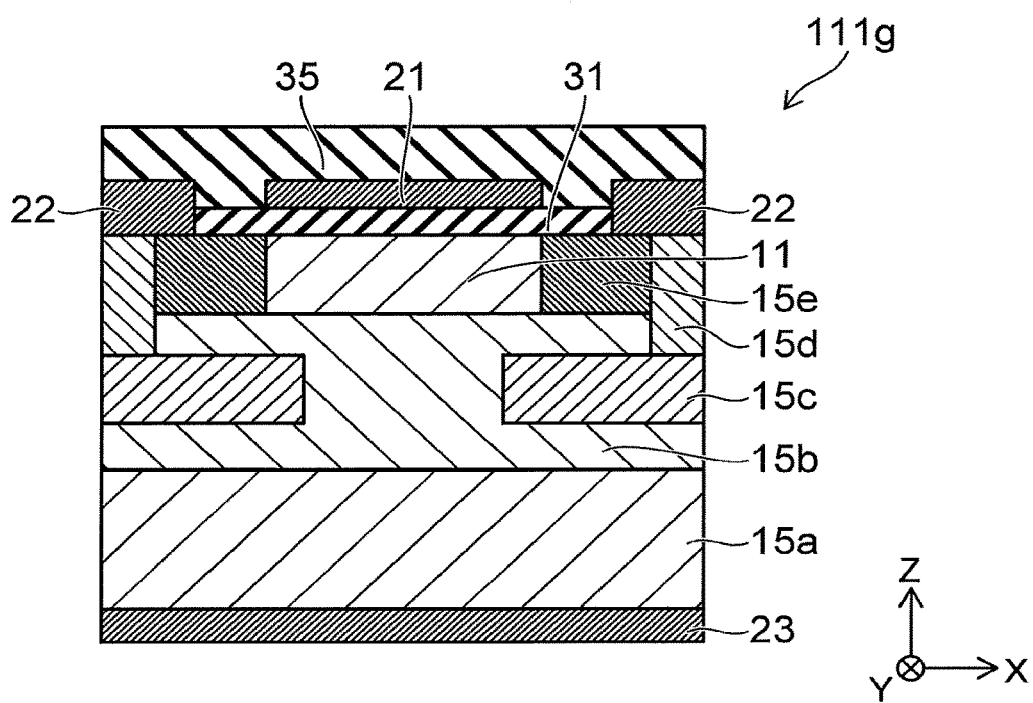
FIG. 18 is a schematic cross-sectional view illustrating the other semiconductor device according to the first embodiment.

In the semiconductor device 111g illustrated in FIG. 18, an n-type GaN layer 15a is provided on the third electrode 23; and an n-type $Al_{y1}Ga_{1-y1}N$ layer 15b (0≤y1≤1) is provided on the n-type GaN layer 15a. An n-type $Al_{z1}Ga_{1-z1}N$ region 15e (0≤z1≤1 and y1<z1) is provided on a portion of the n-type $Al_{y1}Ga_{1-y1}N$ layer 15b. The first semiconductor layer 11 is provided on another portion of the n-type $Al_{y1}Ga_{1-y1}N$ layer 15b. The first semiconductor layer 11 is n-type $Al_{z2}Ga_{1-z2}N$ (0≤z2≤1 and y1<z2). The second electrode 22 is provided on the n-type $Al_{z1}Ga_{1-z1}N$ region 15e. The first insulating film 31 is provided on the first semiconductor layer 11. The first electrode 21 is provided on the first insulating film 31. In the example, a p-type GaN layer 15c is provided in a portion of the n-type $Al_{y1}Ga_{1-y1}N$ layer 15b. A p-type GaN layer 15d is provided between the p-type GaN layer 15c and the second electrode 22. The p-type GaN layer 15c is electrically connected to the second electrode 22 by the p-type GaN layer 15d. The semiconductor device 111g is, for example, a vertical MOSFET.

Figure 19:
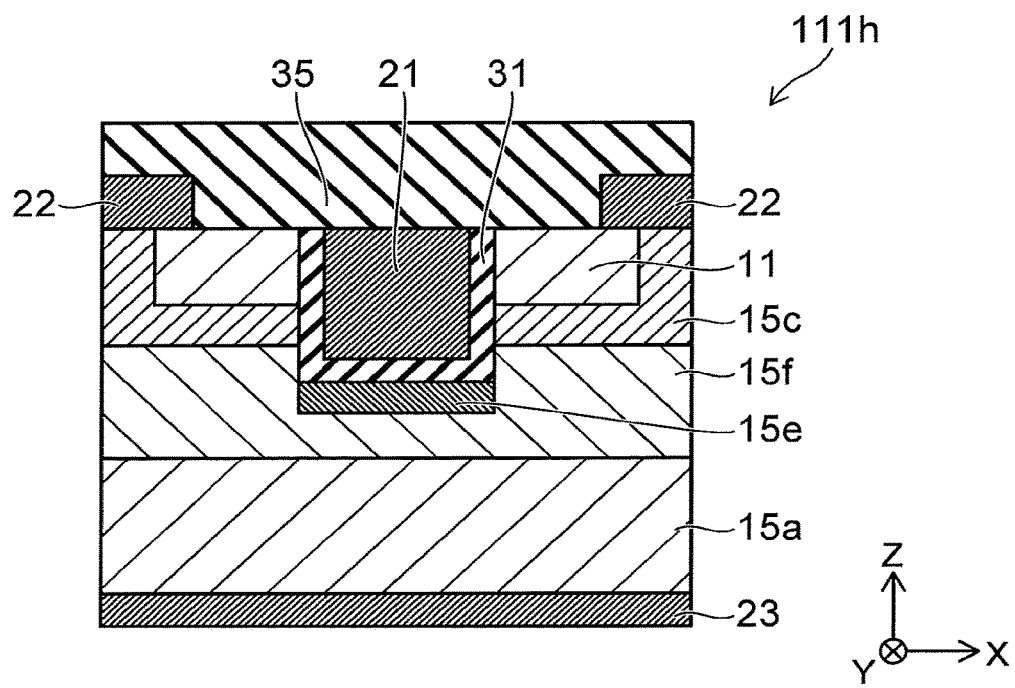
FIG. 19 is a schematic cross-sectional view illustrating the other semiconductor device according to the first embodiment.

In the semiconductor device 111h illustrated in FIG. 19, the n-type GaN layer 15a is provided on the third electrode 23; and a GaN layer 15f is provided on the n-type GaN layer 15a. The p-type GaN layer 15c is provided on a portion of the GaN layer 15f. The n-type $Al_{z1}Ga_{1-z1}N$ region 15e is provided on another portion of the GaN layer 15f. The first semiconductor layer 11 is provided on a portion of the p-type GaN layer 15c. The first semiconductor layer 11 is, for example, n$^+$-type GaN. The second electrode 22 is provided on a portion of the first semiconductor layer 11 and on the p-type GaN layer 15c. The second electrode 22 is disposed in a portion between the insulating layer 35 and the first semiconductor layer 11. The semiconductor device 111h is, for example, a vertical MOSFET.

Figure 20:
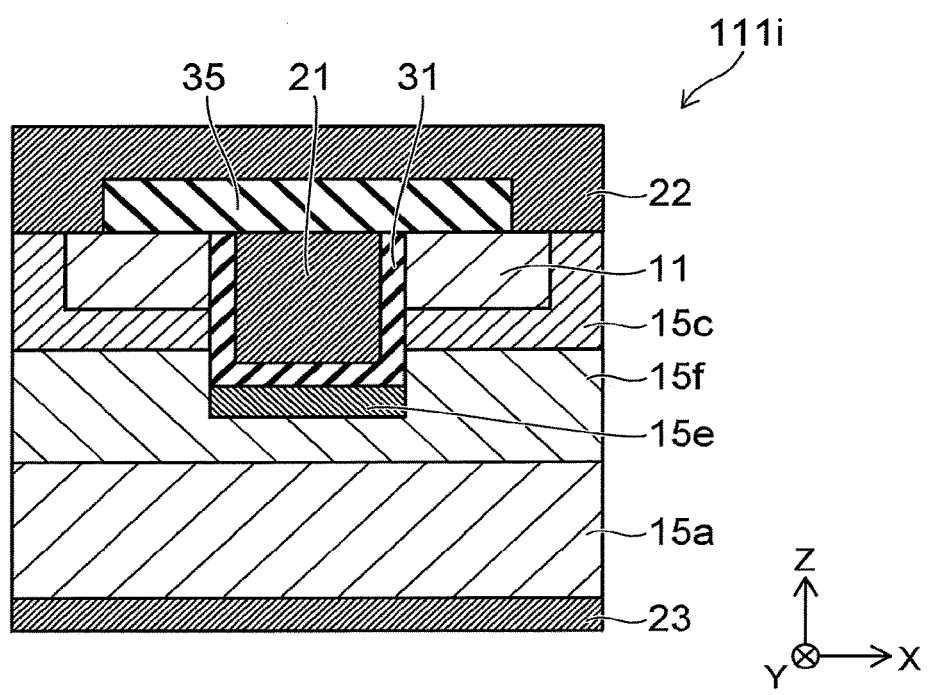
FIG. 20 is a schematic cross-sectional view illustrating the other semiconductor device according to the first embodiment.

In the semiconductor device 111i illustrated in FIG. 20, the insulating layer 35 is disposed at a portion between the second electrode 22 and the first semiconductor layer 11. Otherwise, the configuration of the semiconductor device 111i is similar to that of the semiconductor device 111h.

In the semiconductor devices 111a to 111i as well, the threshold voltage can be stabilized more.

An example of a method for manufacturing the semiconductor device according to the embodiment will now be described. The following example is an example of the method for manufacturing the semiconductor device 110.

FIG. 21A to FIG. 21F are schematic cross-sectional views in order of the processes, illustrating the method for manufacturing the semiconductor device according to the first embodiment.

Figure 21A:
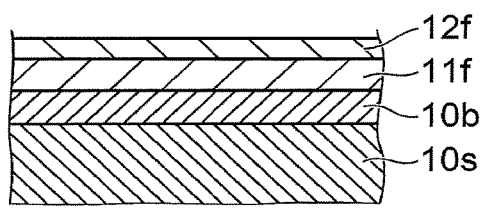
FIG. 21A to FIG. 21F are schematic cross-sectional views in order of the processes, illustrating a method for manufacturing the semiconductor device according to the first embodiment.

As shown in FIG. 21A, a buffer layer 10b is formed on a base body 10s. A first semiconductor film 11f that is used to form the first semiconductor layer 11 is formed on the buffer layer 10b; and a second semiconductor film 12f that is used to form the second semiconductor layer 12 is formed on the first semiconductor film 11f.

Figure 21B:
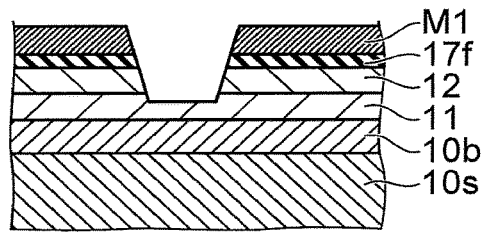

As shown in FIG. 21B, a passivation film 17f (e.g., a SiN film) is formed; and a first resist layer M1 is formed on the passivation film 17f. The first resist layer M1 is patterned; and the protective film 17f also is patterned. The second semiconductor film 12f and the first semiconductor film 11f are patterned using the first resist layer M1 and the protective film 17f as a mask. Thereby, the first semiconductor layer 11 and the second semiconductor layer 12 are obtained. Subsequently, the first resist layer M1 is removed.

Figure 21C:
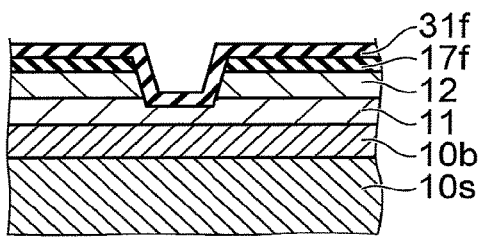

An insulating film 31f that is used to form the first insulating film 31 is formed as shown in FIG. 21C. Subsequently, heat treatment is performed. The heat treatment is set to conditions such that characteristics such as those described in reference to FIG. 1A to FIG. 1C are obtained. For example, a sufficiently high temperature and a sufficiently long time are employed. For example, the heat treatment is performed in an inert gas atmosphere.

Figure 21D:
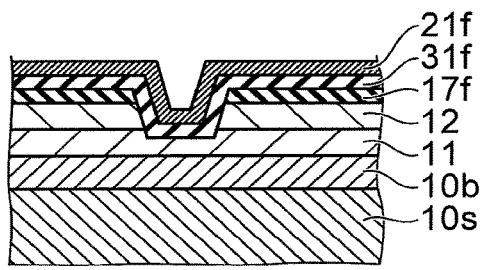

A conductive film 21f that is used to form the first electrode 21 is formed as shown in FIG. 21D. The conductive film 21f is patterned using a mask (not illustrated) having an appropriation opening. Thereby, the first electrode 21 is formed.

Figure 21E:
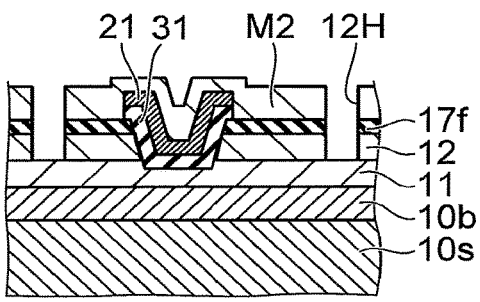
Figure 21F:
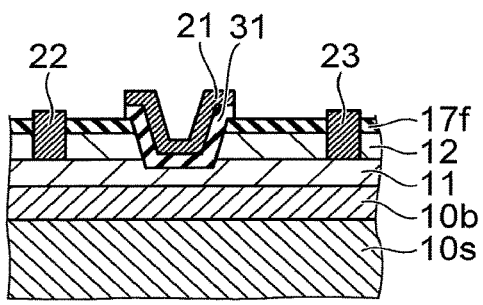

As shown in FIG. 21E, openings 12H are formed in the passivation film 17f and the second semiconductor layer 12 by using a second resist layer M2 having appropriate openings. The second resist layer M2 is removed.

A conductive material is filled into the openings 12H. The second electrode 22 and the third electrode 23 are obtained. Thereby, the semiconductor device 110 is obtained.

Second Embodiment

The embodiment relates to an electrical circuit or an electrical device. The electrical circuit according to the embodiment includes the semiconductor device according to the first embodiment and modifications of the semiconductor device according to the first embodiment. The electrical device according to the embodiment includes such an electrical circuit.

Figure 22:
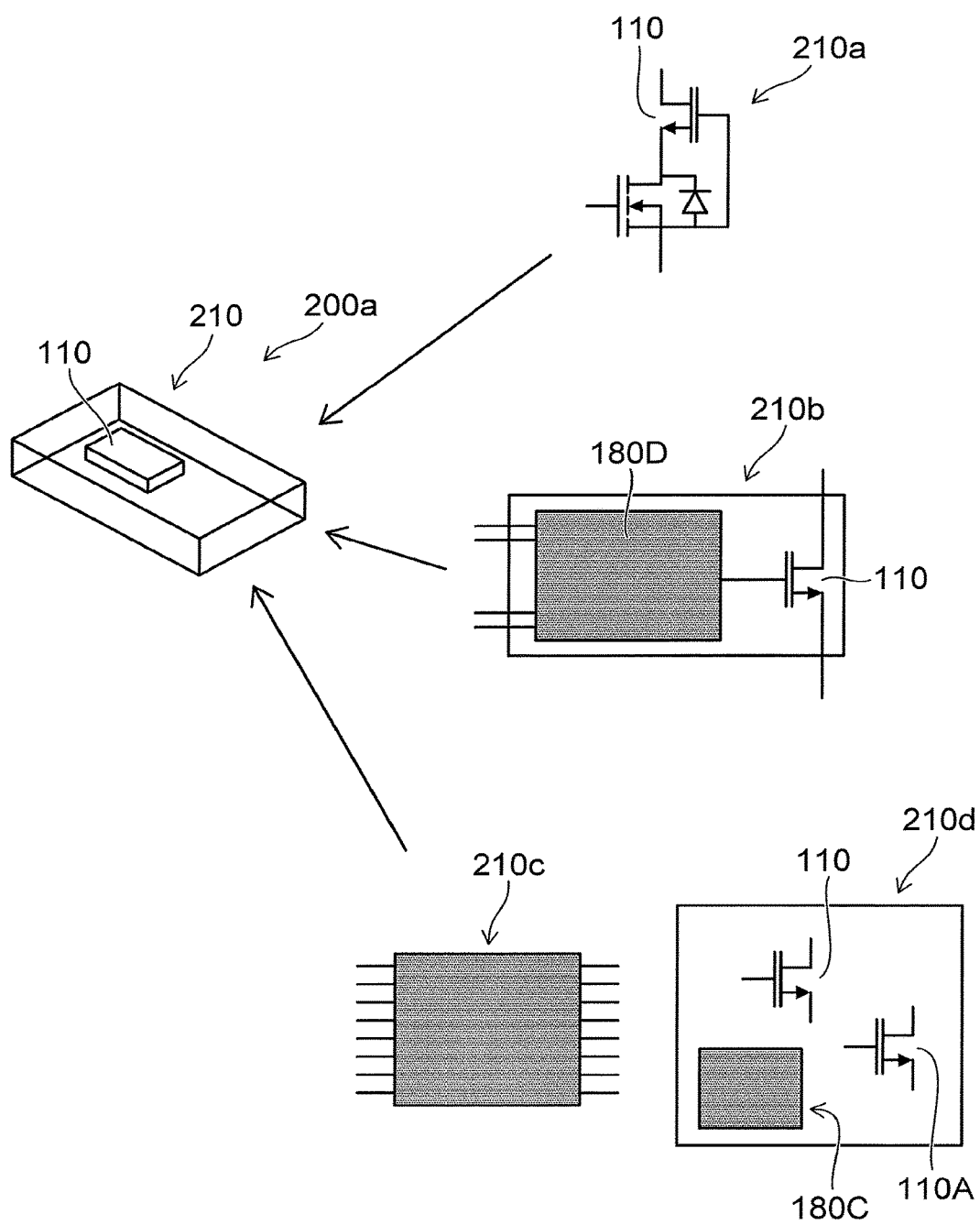
FIG. 22 is a schematic view illustrating an electrical device and electrical circuits according to a second embodiment.

FIG. 22 is a schematic view illustrating the electrical device and the electrical circuit according to the second embodiment.

As shown in FIG. 22, an electrical device 200a according to the embodiment includes an electrical circuit 210. The electrical circuit 210 is, for example, an IC module. The electrical circuit 210 includes the semiconductor device 110. For example, in the example of an electrical circuit 210a, the semiconductor device 110 has a cascode connection with another semiconductor device. The electrical circuit 210a is, for example, a cascode element. For example, in the example of an electrical circuit 210b, the semiconductor device 110 is connected to a driver circuit 180D. The electrical circuit 210b is, for example, an IC. In the example of an electrical circuit 210d, the semiconductor device 110 and a semiconductor device 110A are used with a control circuit 180C. An electrical circuit 210c is, for example, a functional IC.

Figure 23:
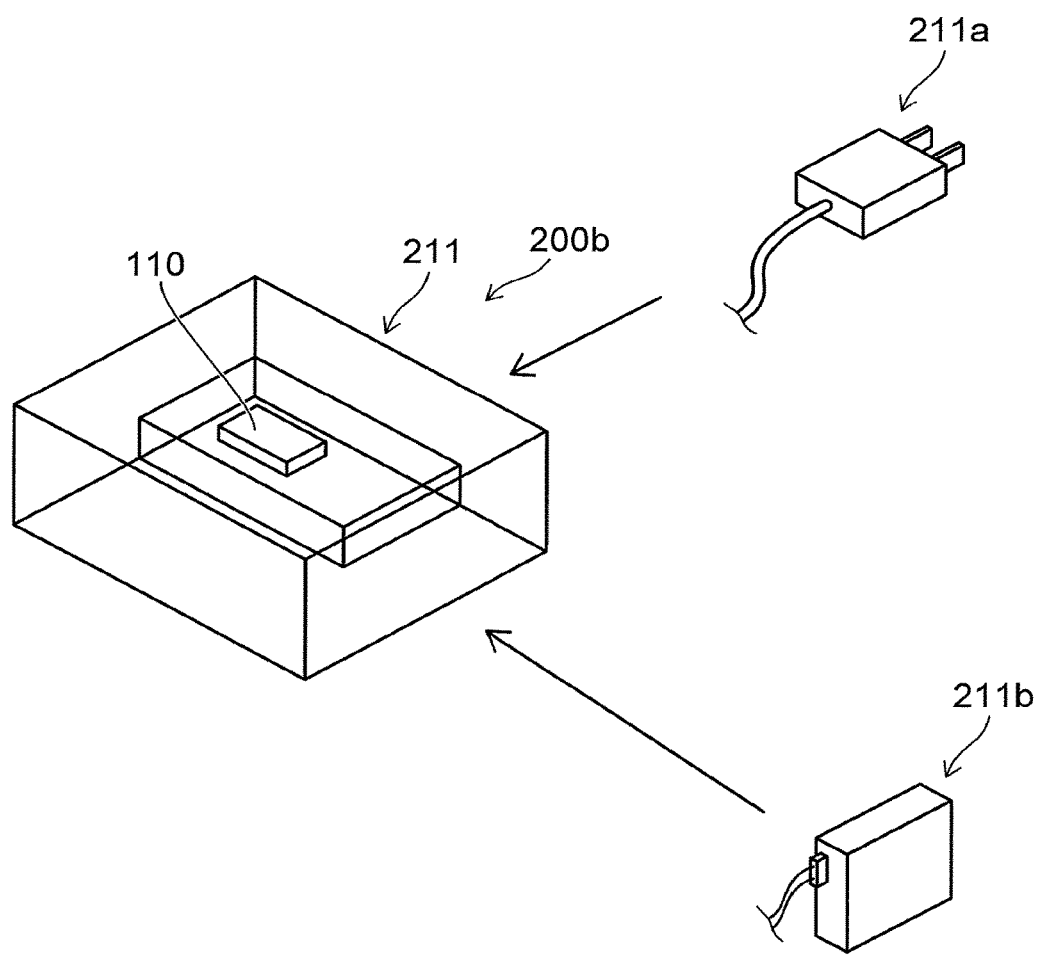
FIG. 23 is a schematic view illustrating other electrical circuits and electrical devices according to the second embodiment.

FIG. 23 is a schematic view illustrating other electrical circuits and electrical devices according to the second embodiment. As shown in FIG. 23, an electrical device 200b includes an electrical circuit 211. The electrical circuit 211 is, for example, a power supply device or a power converter. The electrical circuit 211 includes the semiconductor device 110. For example, an electrical circuit 211a is an AC adapter (a switching power supply). An electrical circuit 211b is, for example, a DC-DC converter, an AC-DC converter, or an inverter.

Figure 24:
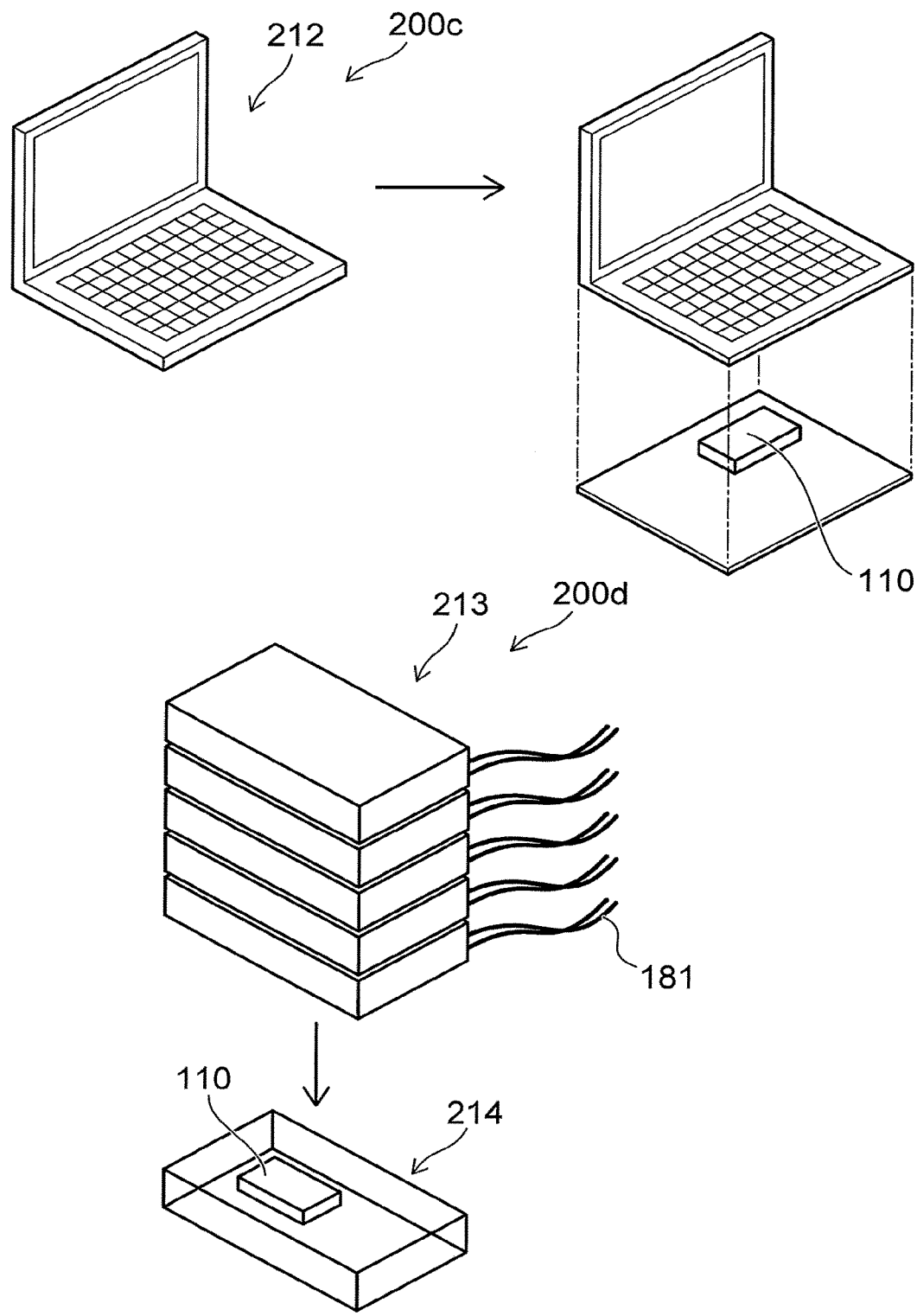
FIG. 24 is a schematic view illustrating other electrical circuits and electrical devices according to the second embodiment.

FIG. 24 is a schematic view illustrating other electrical circuits and electrical devices according to the second embodiment. As shown in FIG. 24, an electrical device 200c includes an electrical circuit 212. The electrical circuit 212 is, for example, a computer. An electrical device 200d includes an electrical circuit 213. The electrical circuit 213 is, for example, a server. The server can communicate via, for example, cables 181, etc. An electrical circuit 214 (e.g., a computer) may be provided in the server. The electrical circuits 212, 213, and 214 include the semiconductor device 110.

Figure 25:
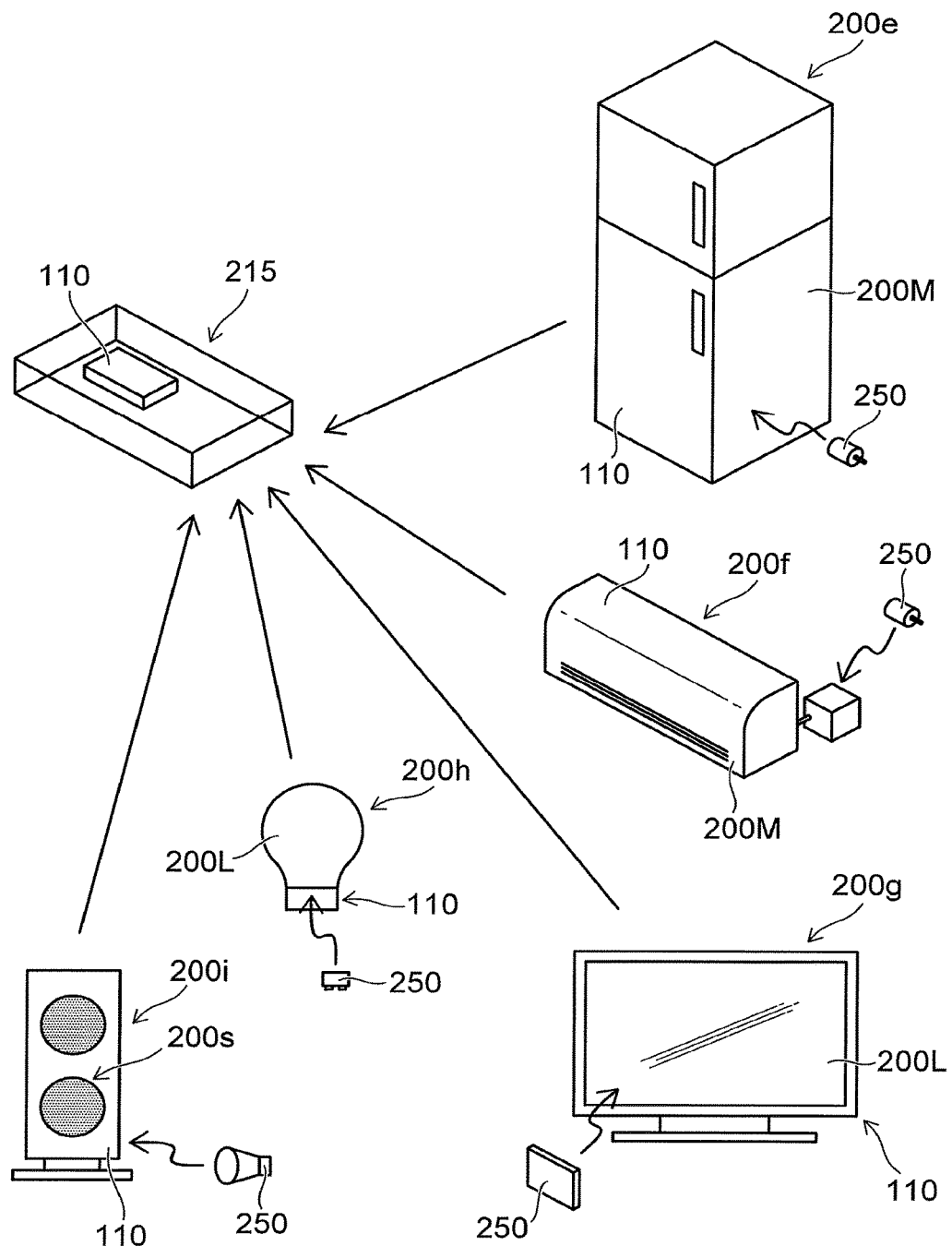
FIG. 25 is a schematic view illustrating other electrical circuits and electrical devices according to the second embodiment.

FIG. 25 is a schematic view illustrating other electrical circuits and electrical devices according to the second embodiment. As shown in FIG. 25, an electrical circuit 215 is provided in electrical devices 200e to 200i. The electrical circuit 215 is, for example, an electronic device. The semiconductor device 110 is provided in the electrical circuit 215. The electrical device 200e is a refrigerator. The electrical device 200f is an air conditioner. The electrical device 200g is a display device (e.g., a television, etc.). The electrical device 200h is lighting. The semiconductor device 110 is provided in the drive circuit (the light adjustment circuit) or the like of the lighting. The electrical device 200i is an acoustic device (e.g., a speaker).

Thus, the electrical device according to the embodiment may include various electrical circuits. The electrical circuit includes, for example, at least one of an electronic circuit, a power supply circuit, a power converter, or a computer. The electrical circuit includes the semiconductor device according to the first embodiment.

The electrical circuit according to the embodiment includes a controlled device 250 controlled by the semiconductor device. The controlled device 250 is, for example, a motor 200M, etc., provided in the electrical device 200e (e.g., the refrigerator). The controlled device 250 is, for example, the motor 200M, etc., provided in the electrical device 200f (e.g., the air conditioner). The controlled device 250 is, for example, a light emitter, etc., provided in the electrical device 200g (the display device, the television, etc.). The controlled device 250 is, for example, a light-emitting element 200L, etc., provided in the electrical device 200h (e.g., the lighting). The controlled device 250 is, for example, a coil 200S, etc., provided in the electrical device 200e (e.g., the acoustic device).

The electrical device according to the embodiment may include a moving apparatus (e.g., at least one of an automobile, a two-wheeled vehicle, an electric train, a ship, or an aircraft) including a motor, etc.

The embodiment may include the following configurations (e.g., "technological proposals").

(Configuration 1)

A semiconductor device, comprising:

a first semiconductor layer including a nitride semiconductor;

a first electrode separated from the first semiconductor layer in a first direction; and a first insulating film including silicon and oxygen and being provided between the first semiconductor layer and the first electrode, the first insulating film having a first thickness in the first direction, the first insulating film including a first position, a distance between the first position and the first semiconductor layer being ½ of the first thickness, a first hydrogen concentration of hydrogen at the first position being $2.5 \times 10^{19}$ atoms/cm$^3$ or less.

(Configuration 2)

The semiconductor device according to configuration 1, wherein a stacked region including the first semiconductor layer and the first insulating film includes a nitrogen peak position, a concentration of nitrogen in the stacked region has a peak at the nitrogen peak position, the first insulating film includes a second position, a second hydrogen concentration of hydrogen at the second position is a peak of a concentration of hydrogen in a region between the first position and the first semiconductor layer, a distance along the first direction between the second position and the nitrogen peak position is 10 nm or less, and the first hydrogen concentration is not more than 0.041 times the second hydrogen concentration.

(Configuration 3)

The semiconductor device according to configuration 2, wherein the second hydrogen concentration is $3 \times 10^{21}$ atoms/cm$^3$ or less.

(Configuration 4)

The semiconductor device according to configuration 3, wherein the second hydrogen concentration is $2 \times 10^{19}$ atoms/cm$^3$ or more.

(Configuration 5)

The semiconductor device according to configuration 2, wherein a second fluorine concentration of fluorine at the second position is $3.5 \times 10^{17}$ atoms/cm$^3$ or less.

(Configuration 6)

The semiconductor device according to configuration 5, wherein a first fluorine concentration of fluorine at the first position is not more than 0.36 times the second fluorine concentration.

(Configuration 7)

The semiconductor device according to configuration 6, wherein the first fluorine concentration is $4 \times 10^{16}$ atoms/cm$^3$ or less.

(Configuration 8)

A semiconductor device, comprising:

a first semiconductor layer including a nitride semiconductor;

a first electrode separated from the first semiconductor layer in a first direction; and a first insulating film including silicon and oxygen and being provided between the first semiconductor layer and the first electrode, the first insulating film having a first thickness in the first direction, the first insulating film including a first position, a distance between the first position and the first semiconductor layer being ½ of the first thickness, a first fluorine concentration of fluorine at the first position being $4\times10^{16}$ atoms/cm$^3$ or less.

(Configuration 9)

The semiconductor device according to configuration 8, wherein a stacked region including the first semiconductor layer and the first insulating film includes a nitrogen peak position, a concentration of nitrogen in the stacked region has a peak at the nitrogen peak position, the first insulating film includes a third position, a third fluorine concentration of fluorine at the third position is a peak of a concentration of fluorine in a region between the first position and the first semiconductor layer, a distance along the first direction between the third position and the nitrogen peak position is 10 nm or less, and the first fluorine concentration is not more than 0.36 times the third fluorine concentration.

(Configuration 10)

The semiconductor device according to configuration 9, wherein the third fluorine concentration is $3.5\times10^{17}$ atoms/cm$^3$ or less.

(Configuration 11)

The semiconductor device according to configuration 10, wherein the third fluorine concentration is $2\times10^{16}$ atoms/cm$^3$ or more.

(Configuration 12)

The semiconductor device according to one of configurations 1 to 11, wherein a bond angle of silicon-oxygen-silicon in the first insulating film is not less than 142 degrees but less than 144 degrees.

(Configuration 13)

The semiconductor device according to one of configurations 1 to 12, wherein the first insulating film includes:

a first region; and a second region positioned between the first region and the first semiconductor layer, the second region includes nitrogen, and the first region does not include nitrogen, or a concentration of nitrogen in the first region is lower than a concentration of nitrogen in the second region.

(Configuration 14)

The semiconductor device according to one of configurations 1 to 12, wherein the first insulating film includes:

a first region; and a second region positioned between the first region and the first semiconductor layer, the second region includes at least one first element of aluminum or gallium, and the first region does not include the first element, or a concentration of the first element in the first region is lower than a concentration of the first element in the second region.

(Configuration 15)

The semiconductor device according to one of configurations 1 to 12, wherein a region between the first insulating film and the first semiconductor layer includes at least one selected from a second element, oxygen, and nitrogen, and the second element includes at least one selected from the group consisting of silicon, aluminum, and gallium.

(Configuration 16)

The semiconductor device according to one of configurations 1 to 15, further comprising a second insulating film provided between the first insulating film and the first electrode, a material included in the second insulating film being different from a material included in the first insulating film.

(Configuration 17)

The semiconductor device according to one of configurations 1 to 16, further comprising:

a second electrode; and a third electrode separated from the second electrode in a second direction crossing the first direction, the first semiconductor layer including a first partial region, a second partial region, and a third partial region, the first partial region being positioned between the second partial region and the third partial region, a direction from the second partial region toward the third partial region being aligned with the second direction, the second electrode being electrically connected to the second partial region, the third electrode being electrically connected to the third partial region, a direction from the first partial region toward the first electrode being aligned with the first direction.

(Configuration 18)

The semiconductor device according to configurations 1 to 16, further comprising:

a second semiconductor layer;

a second electrode; and a third electrode, a direction from the first electrode toward the second electrode crossing the first direction, the first semiconductor layer being positioned between the third electrode and the first electrode and between the third electrode and the second electrode, the second electrode being electrically connected to the second semiconductor layer, the third electrode being electrically connected to the first semiconductor layer.

(Configuration 19)

An electrical device, comprising an electrical circuit including at least one of an electronic circuit, a power supply circuit, a power converter, or a computer, the at least one including the semiconductor device according to one of configurations 1 to 18.

(Configuration 20)

The electrical device according to configuration 19, wherein the electrical circuit includes a controlled device, the controlled device being controlled by the semiconductor device.

According to the embodiments, a semiconductor device and an electrical device can be provided in which the operations can be stabilized.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

In the specification, "nitride semiconductor" includes all compositions of semiconductors of the chemical formula $B_xIn_yAl_zGa_{1-x-y-z}N$ ($0\leq x\leq 1$, $0\leq y\leq 1$, $0\leq z\leq 1$, and $x+y+z\leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor layers, electrodes, insulating films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and electrical devices practicable by an appropriate design modification by one skilled in the art based on the semiconductor devices, and electrical devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a first semiconductor layer including a nitride semiconductor;
    a first electrode separated from the first semiconductor layer in a first direction; and
    a first insulating film including silicon and oxygen and being provided between the first semiconductor layer and the first electrode,
    the first insulating film having a first thickness in the first direction,
    the first insulating film including a first position, a distance between the first position and the first semiconductor layer being ½ of the first thickness,
    a first hydrogen concentration of hydrogen at the first position being $2.5 \times 10^{19}$ atoms/cm$^3$ or less,
    wherein a stacked region including the first semiconductor layer and the first insulating film includes a nitrogen peak position, and
    a concentration of nitrogen in the stacked region has a peak at the nitrogen peak position, the peak corresponding to a highest nitrogen concentration in the stacked region and no other position in the stacked region having the highest concentration of nitrogen.

2. The device according to claim 1, wherein the first insulating film includes a second position,
    a second hydrogen concentration of hydrogen at the second position is a peak of a concentration of hydrogen in a region between the first position and the first semiconductor layer,
    a distance along the first direction between the second position and the nitrogen peak position is 10 nm or less, and
    the first hydrogen concentration is not more than 0.041 times the second hydrogen concentration.

3. The device according to claim 2, wherein the second hydrogen concentration is $3 \times 10^{21}$ atoms/cm$^3$ or less.

4. The device according to claim 3, wherein the second hydrogen concentration is $2 \times 10^{19}$ atoms/cm$^3$ or more.

5. The device according to claim 2, wherein a second fluorine concentration of fluorine at the second position is $3.5 \times 10^{17}$ atoms/cm$^3$ or less.

6. The device according to claim 5, wherein a first fluorine concentration of fluorine at the first position is not more than 0.36 times the second fluorine concentration.

7. The device according to claim 6, wherein the first fluorine concentration is $4 \times 10^{16}$ atoms/cm$^3$ or less.

8. The device according to claim 1, wherein a bond angle of silicon-oxygen-silicon in the first insulating film is not less than 142 degrees but less than 144 degrees.

9. The device according to claim 1, wherein the first insulating film includes:
    a first region; and
    a second region positioned between the first region and the first semiconductor layer, the second region includes nitrogen, and
    the first region does not include nitrogen, or the first region includes nitrogen and a concentration of nitrogen in the first region is lower than a concentration of nitrogen in the second region.

10. The device according to claim 1, wherein
    the first insulating film includes:
    a first region; and
    a second region positioned between the first region and the first semiconductor layer, the second region includes at least one first element of aluminum or gallium, and
    the first region does not include the first element, or the first region includes the first element and a concentration of the first element in the first region is lower than a concentration of the first element in the second region.

11. The device according to claim 1, wherein
    a region between the first insulating film and the first semiconductor layer includes at least one selected from a second element, oxygen, and nitrogen, and
    the second element includes at least one selected from the group consisting of silicon, aluminum, and gallium.

12. The device according to claim 1, further comprising a second insulating film provided between the first insulating film and the first electrode,
    a material included in the second insulating film being different from a material included in the first insulating film.

13. The device according to claim 1, further comprising:
    a second electrode; and
    a third electrode separated from the second electrode in a second direction crossing the first direction,
    the first semiconductor layer including
    a first partial region,
    a second partial region, and
    a third partial region, the first partial region being positioned between the second partial region and the third partial region, a direction from the second partial region toward the third partial region being aligned with the second direction, the second electrode being electrically connected to the second partial region, the third electrode being electrically connected to the third partial region, a direction from the first partial region toward the first electrode being aligned with the first direction.

14. The device according to claim 1, further comprising:
a second semiconductor layer;
a second electrode; and
a third electrode,
a direction from the first electrode toward the second electrode crossing the first direction,
the first semiconductor layer being positioned between the third electrode and the first electrode and between the third electrode and the second electrode,
the second electrode being electrically connected to the second semiconductor layer,
the third electrode being electrically connected to the first semiconductor layer.

15. An electrical device, comprising at least one selected from a group consisting of an electrical circuit, a power supply circuit, a power converter, or a computer, the at least one including the semiconductor device according to claim 1.

16. The electrical device according to claim 15, wherein the electrical circuit includes a controlled device, the controlled device being controlled by the semiconductor device.

17. The device according to claim 2, wherein a concentration of hydrogen at the nitrogen peak position is lower than the second hydrogen concentration.

18. A semiconductor device, comprising:
a first semiconductor layer including a nitride semiconductor;
a first electrode separated from the first semiconductor layer in a first direction; and
a first insulating film including silicon and oxygen and being provided between the first semiconductor layer and the first electrode,
the first insulating film having a first thickness in the first direction,
the first insulating film including a first position, a distance between the first position and the first semiconductor layer being ½ of the first thickness,
a first fluorine concentration of fluorine at the first position being $4 \times 10^{16}$ atoms/cm$^3$ or less,
a stacked region including the first semiconductor layer and the first insulating film includes a nitrogen peak position, and
a concentration of nitrogen in the stacked region has a peak at the nitrogen peak position, the peak corresponding to a highest nitrogen concentration in the stacked region and no other position in the stacked region having the highest concentration of nitrogen.

19. The device according to claim 18, wherein
the first insulating film includes a third position,
a third fluorine concentration of fluorine at the third position is a peak of a concentration of fluorine in a region between the first position and the first semiconductor layer,
a distance along the first direction between the third position and the nitrogen peak position is 10 nm or less, and
the first fluorine concentration is not more than 0.36 times the third fluorine concentration.

20. The device according to claim 19, wherein the third fluorine concentration is $3.5 \times 10^{17}$ atoms/cm$^3$ or less.

21. The device according to claim 20, wherein the third fluorine concentration is $2 \times 10^{16}$ atoms/cm$^3$ or more.

* * * * *